US 8,552,763 B2

(12) United States Patent
Abe

(10) Patent No.: US 8,552,763 B2
(45) Date of Patent: Oct. 8, 2013

(54) SWITCH ARRAY INCLUDING ACTIVE REGIONS BEING ADJACENT TO EACH OTHER IN CHANNEL WIDTH DIRECTION OF MEMORY CELL TRANSISTOR

(75) Inventor: Keiko Abe, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 197 days.

(21) Appl. No.: 13/206,730

(22) Filed: Aug. 10, 2011

(65) Prior Publication Data
US 2012/0074467 A1    Mar. 29, 2012

(30) Foreign Application Priority Data

Sep. 27, 2010  (JP) .................................. 2010-215836

(51) Int. Cl.
*H03K 19/173* (2006.01)
(52) U.S. Cl.
USPC ........................................... 326/119; 365/156
(58) Field of Classification Search
USPC .................. 326/39, 105, 119; 365/154, 156, 365/189.07
See application file for complete search history.

(56) References Cited

U.S. PATENT DOCUMENTS 5,812,450 A    9/1998   Sansbury et al. ........ 365/185.01

FOREIGN PATENT DOCUMENTS

| JP | 3-123118 A | 5/1991 |
| JP | 4-183114 A | 6/1992 |
| JP | 9-248440 A | 9/1997 |

OTHER PUBLICATIONS

Japanese Office Action dated Aug. 21, 2012 from corresponding JP Application No. 2010-215836, 5 pages.

*Primary Examiner* — Thomas L Dickey
(74) *Attorney, Agent, or Firm* — Ohlandt, Greeley, Ruggiero & Perle, L.L.P.

(57) ABSTRACT

According to one embodiment, a switch array includes first and second switches provided in a switch unit. The first switch includes first and second memory cell transistors and a first pass transistor. A second switch includes third and fourth memory cell transistors and a second pass transistor. The first and second memory cell transistor is provided in a first active region. The first pass transistor is provided in a second active region in the substrate. The third and fourth memory cell transistor is provided in the first active region. The second pass transistor is provided in the second active region adjacent to the first pass transistor in the channel length direction. The first and second active regions are adjacent to each other in a channel width direction.

20 Claims, 25 Drawing Sheets

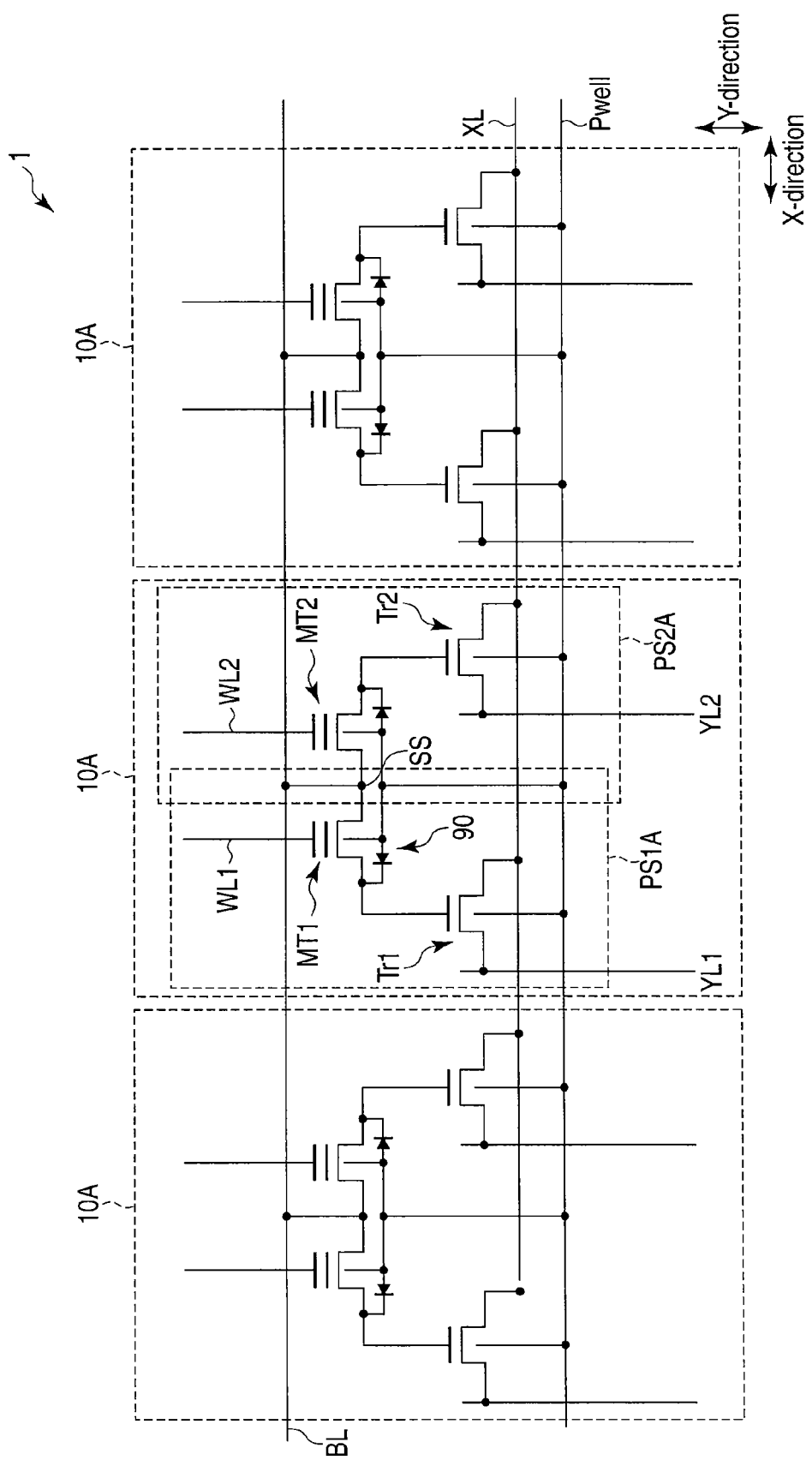
F I G. 1

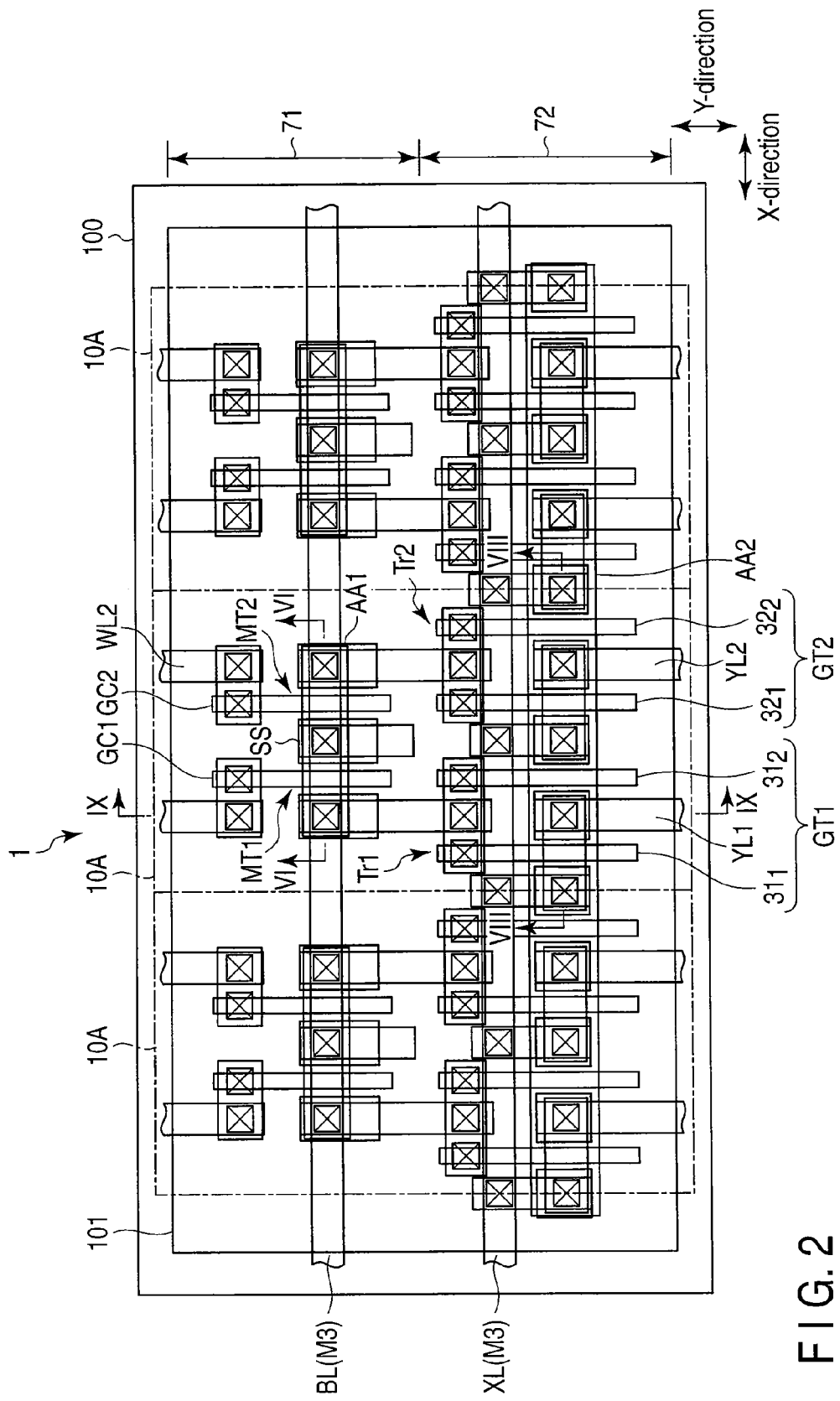
F I G. 2

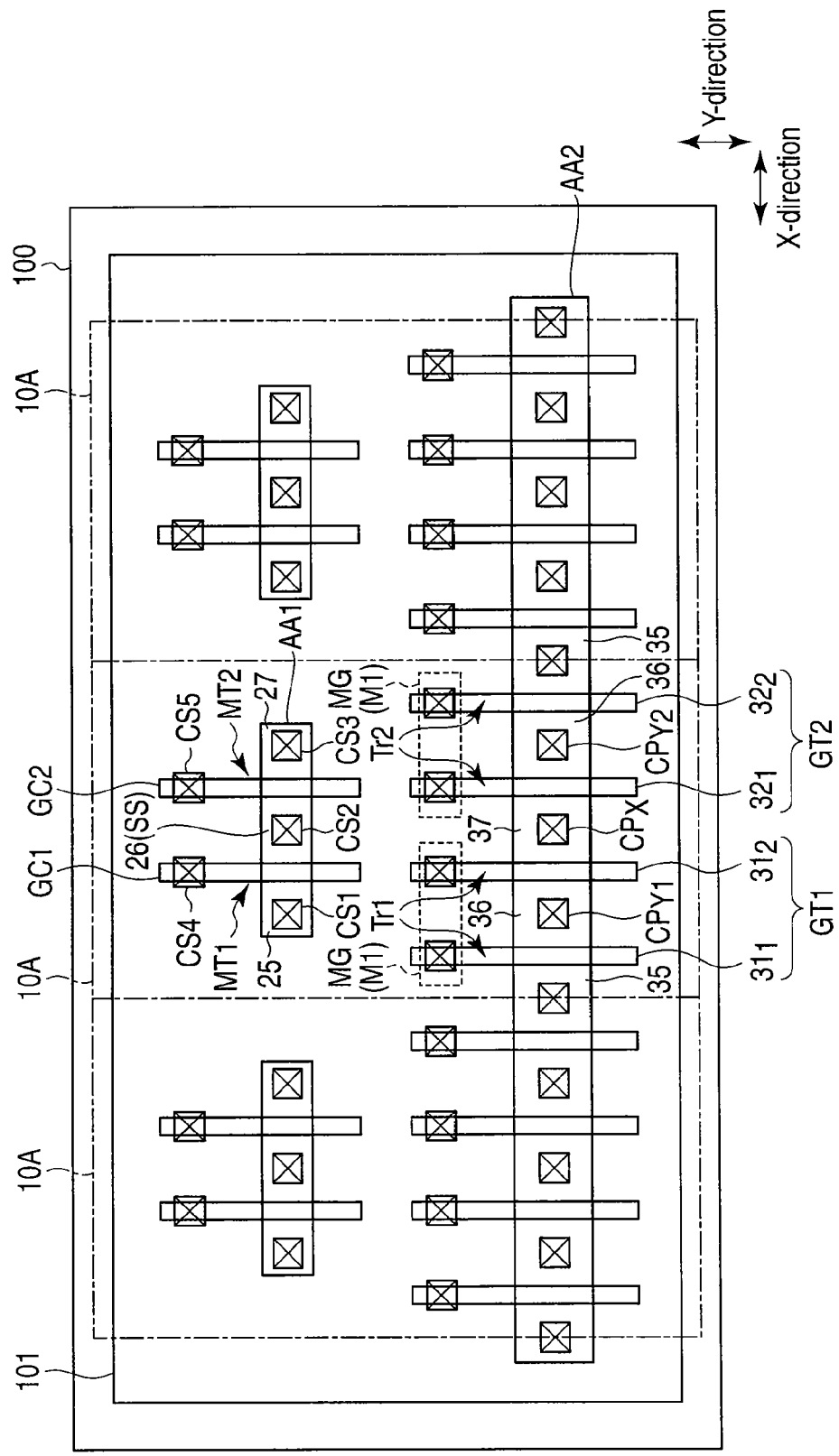
F I G. 3

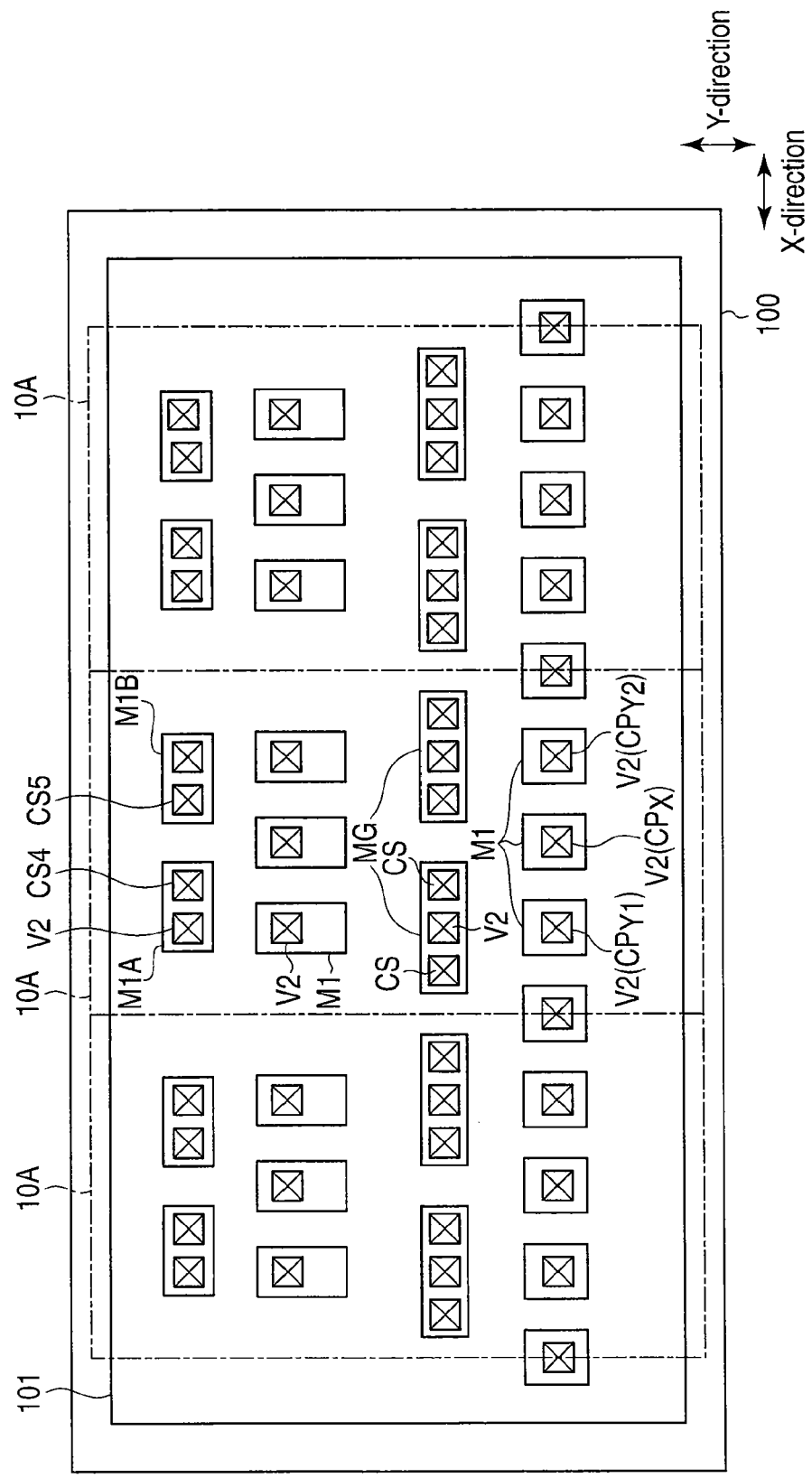
F I G. 4

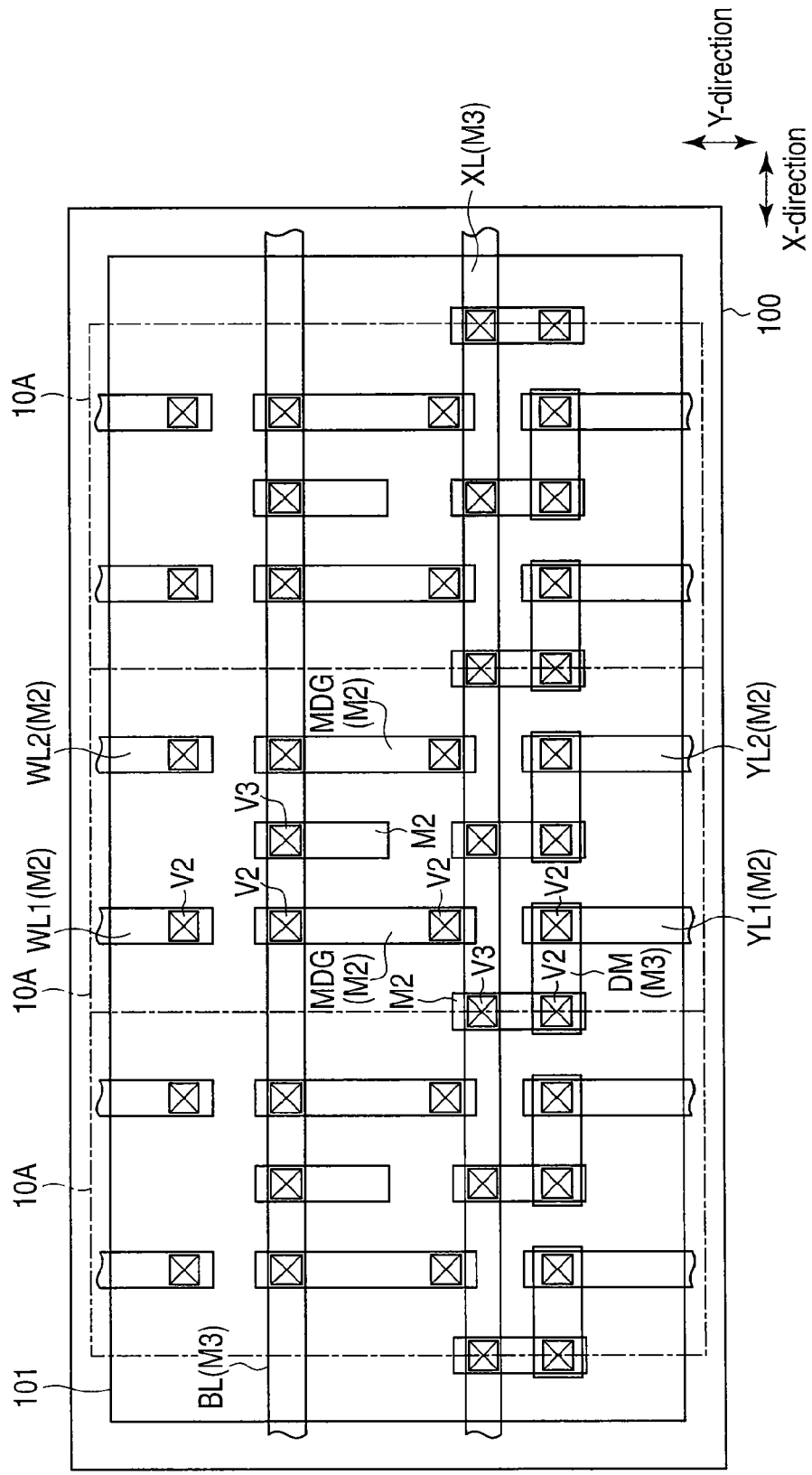
F I G. 5

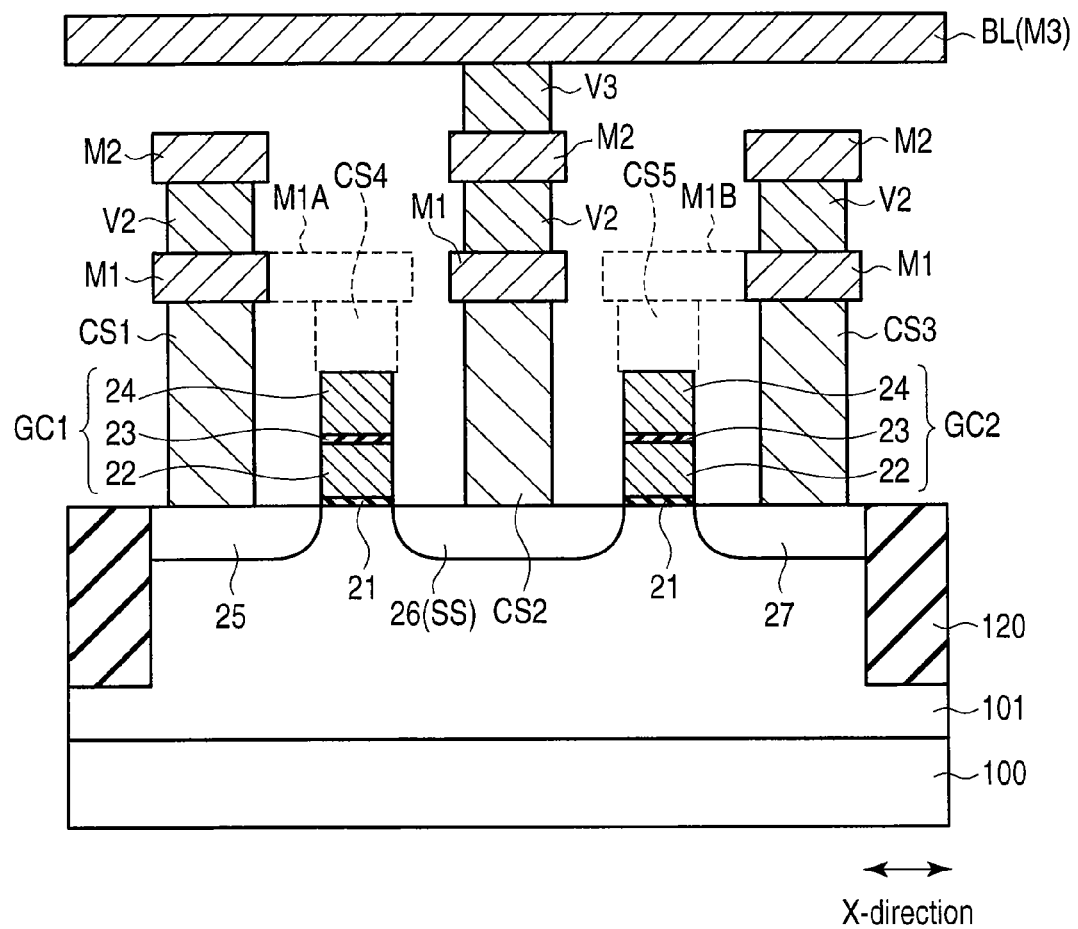
F I G. 6

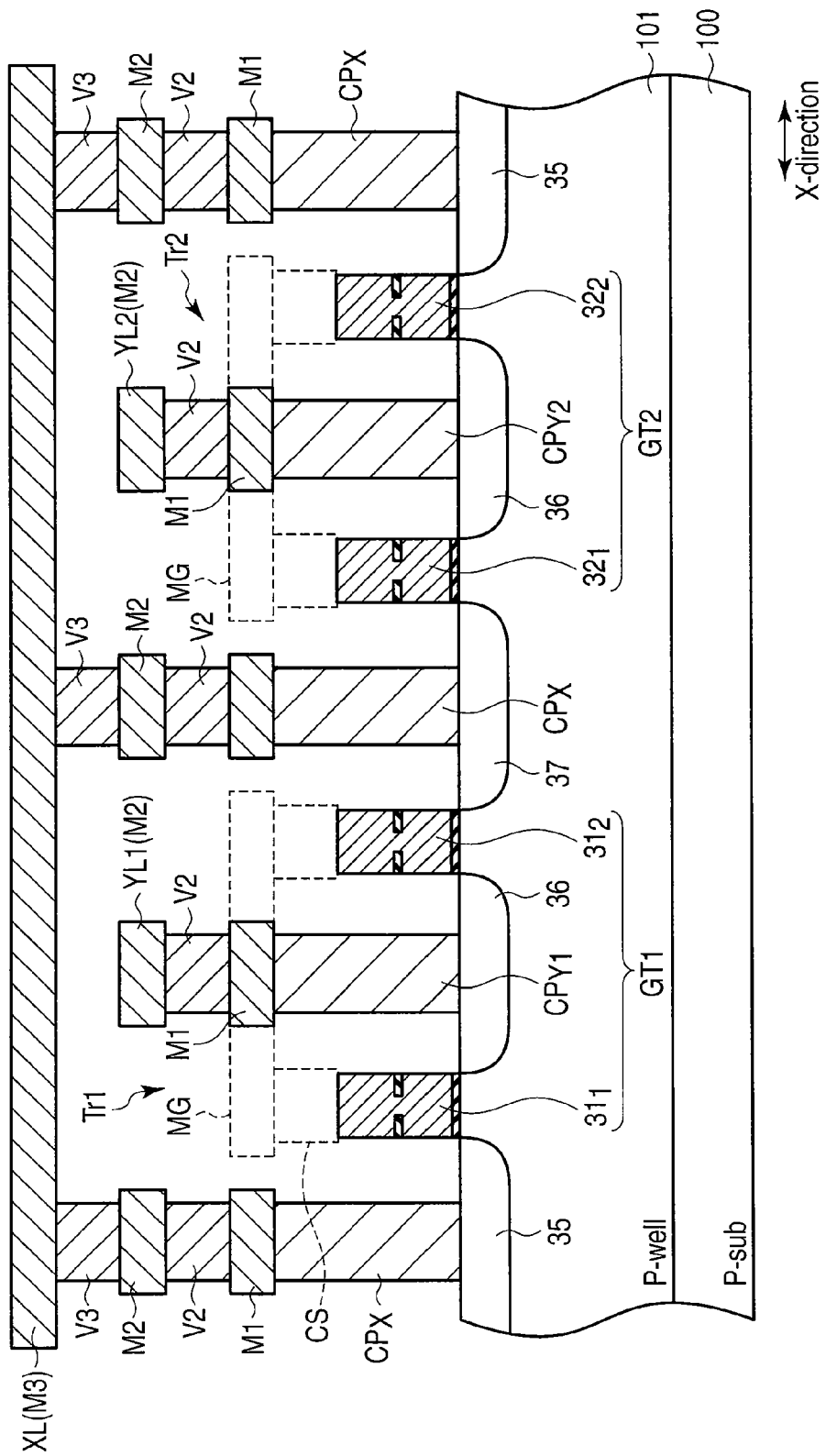
F I G. 8

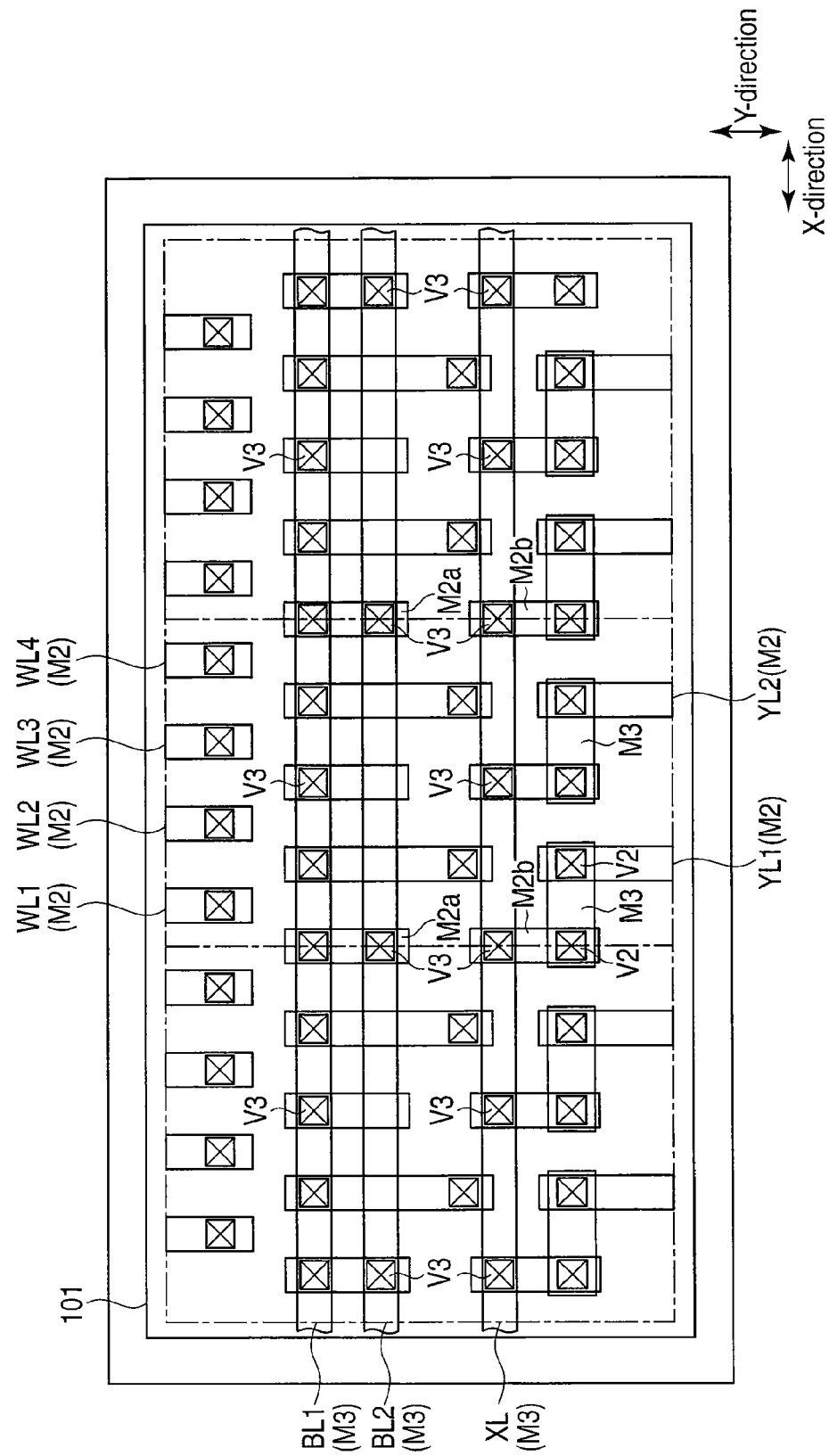
F I G. 20

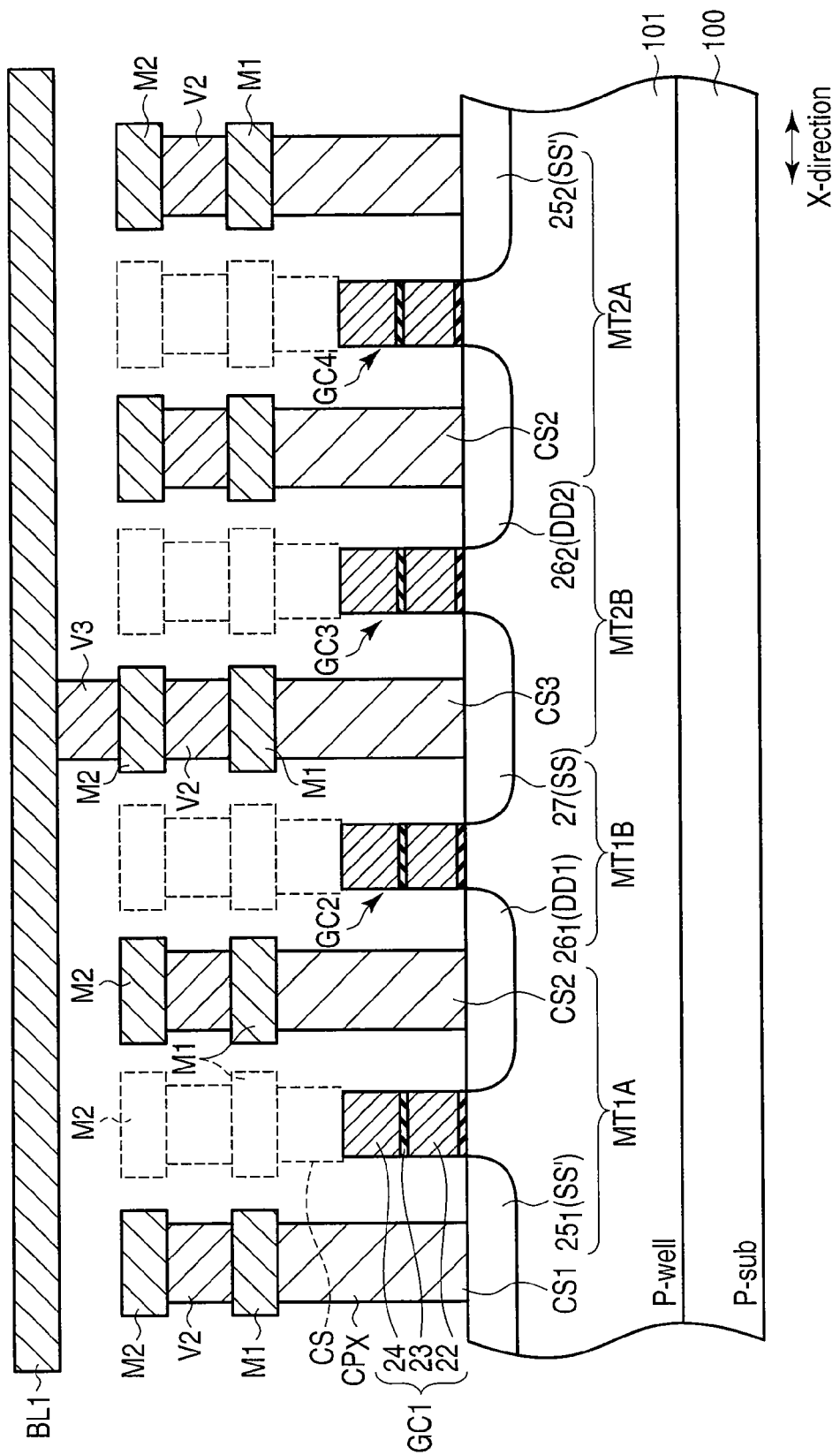
F I G. 21

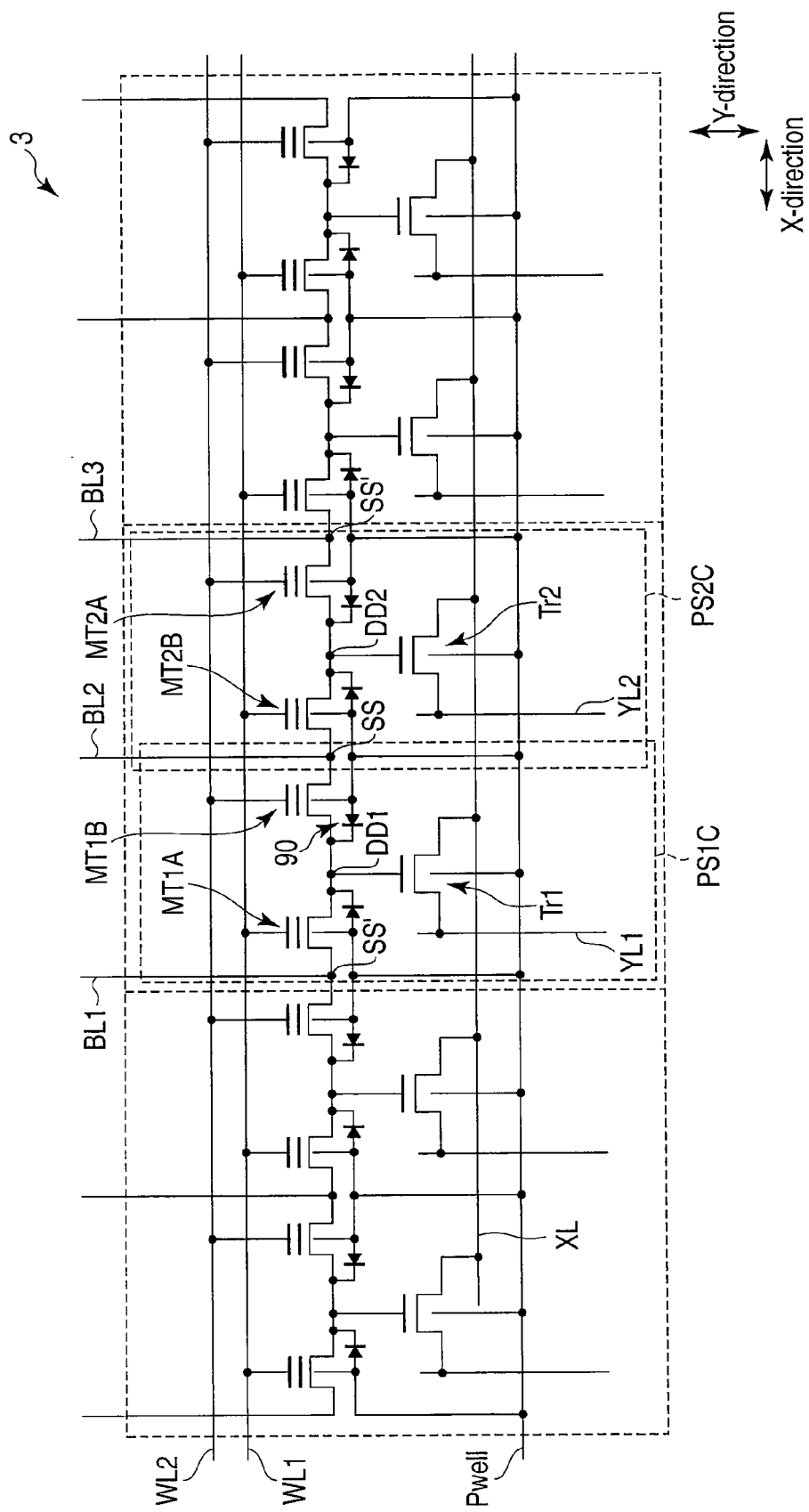
F I G. 22

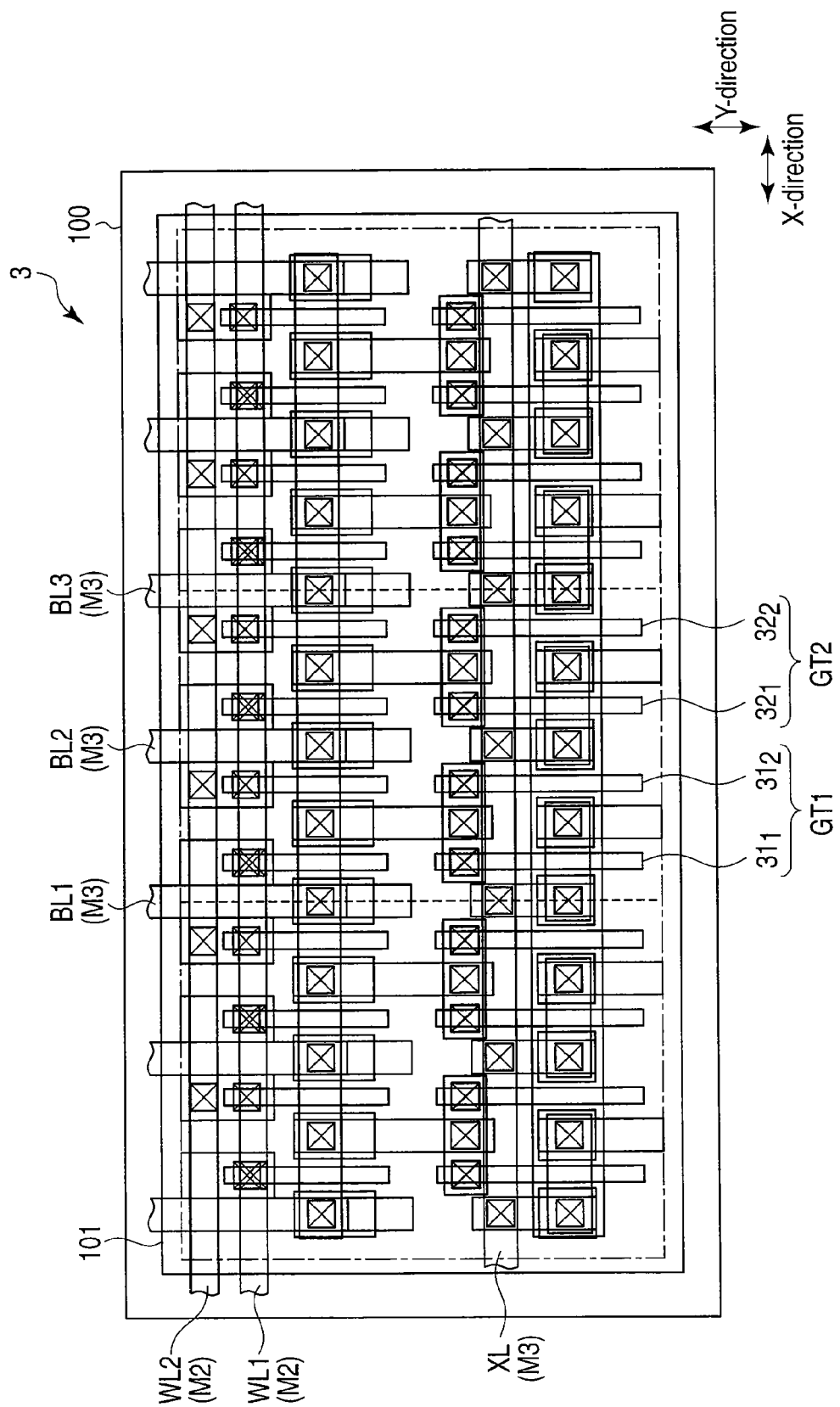
F I G. 23

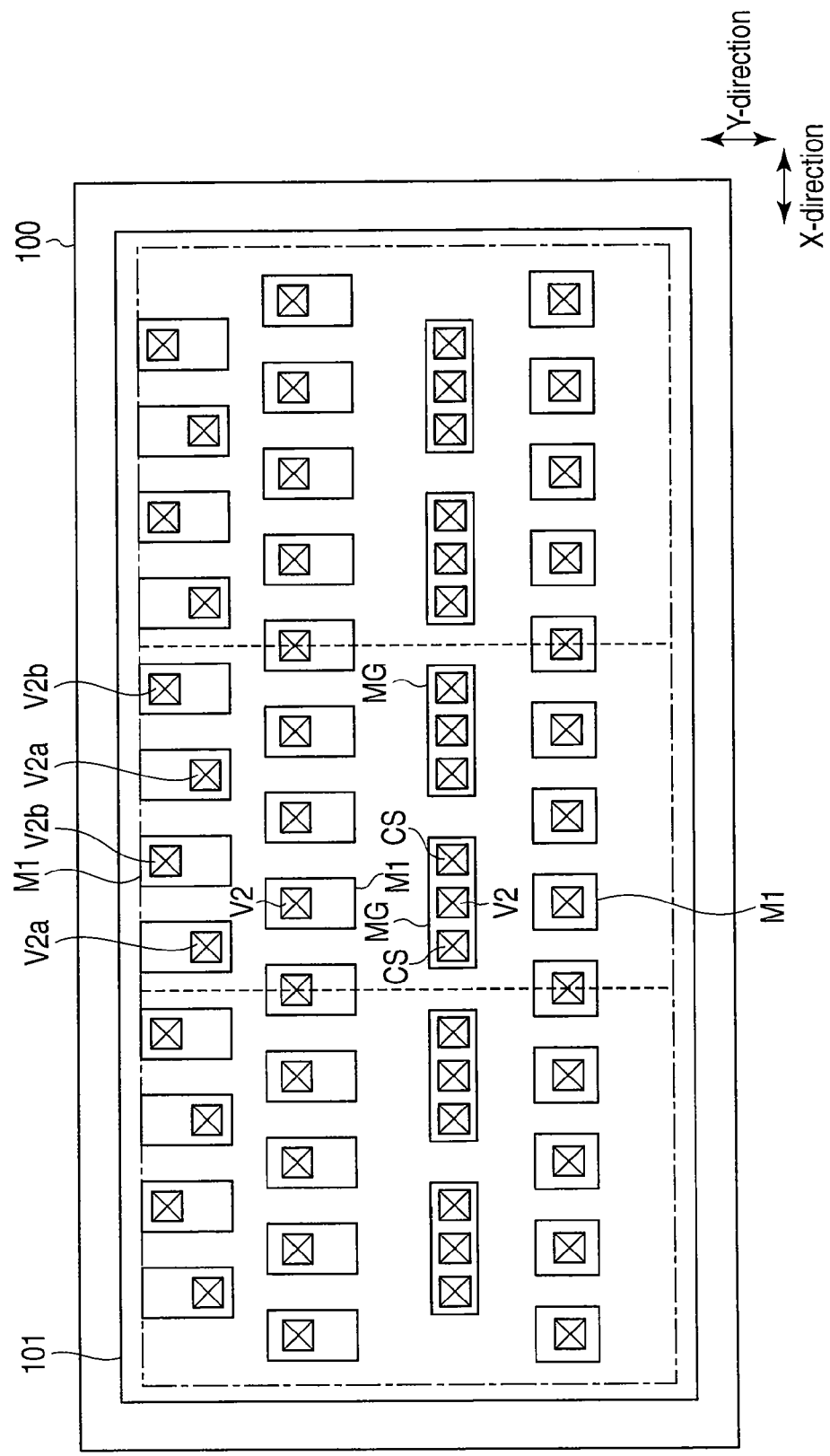
F I G. 24

US 8,552,763 B2

SWITCH ARRAY INCLUDING ACTIVE REGIONS BEING ADJACENT TO EACH OTHER IN CHANNEL WIDTH DIRECTION OF MEMORY CELL TRANSISTOR

CROSS-REFERENCE TO RELATED APPLICATIONS

This application is based upon and claims the benefit of priority from prior Japanese Patent Application No. 2010-215836, filed Sep. 27, 2010, the entire contents of which are incorporated herein by reference.

FIELD

Embodiments described herein relate generally to a switch array.

BACKGROUND

A FPGA (Field Programmable Gate Array) can reduce a development period of an LSI chip because the user can rewrite a circuit of the chip to a desired circuit after the chip is manufactured/shipped.

The FPGA is a circuit including, for example, a plurality of logic gates based on a lookup table (LUT) and a plurality of switch to switch connection between logic gates.

The FPGA includes a configuration memory to control connection relationships between the LUT and the switch. The FPGA can configure any circuit by information stored in the memory being rewritten.

An SRAM (Static Random Access Memory) is generally used as the configuration memory.

The SRAM is a volatile memory and thus, when the supply of power supply voltage is stopped, stored data is lost. Therefore, after being turned on again, it is necessary for the configuration memory using the SRAM to reacquire and rewrite memory information. A 1-bit memory cell of an SRAM is formed of six field-effect transistors. Thus, the memory cell of an SRAM has a large cell size.

Therefore, development of a programmable switch whose circuit size (cell size) is small with a configuration memory using a nonvolatile memory element is promoted.

BRIEF DESCRIPTION OF THE DRAWINGS

FIG. 1 is an equivalent circuit diagram of a switch array according to a first embodiment;
FIGS. 2 to 5 are plane views of the switch array according to the first embodiment;
FIGS. 6 to 9 are sectional views of the switch array according to the first embodiment;
FIGS. 17 to 20 are plane views of the switch array according to the first embodiment;
FIG. 21 is a sectional view of the switch array according to the third embodiment;
FIG. 22 is an equivalent circuit diagram of a modification of the switch array according to the third embodiment;
and
FIGS. 23 to 25 are plane views of a modification of the switch array according to the third embodiment.

DETAILED DESCRIPTION

Figure 7:
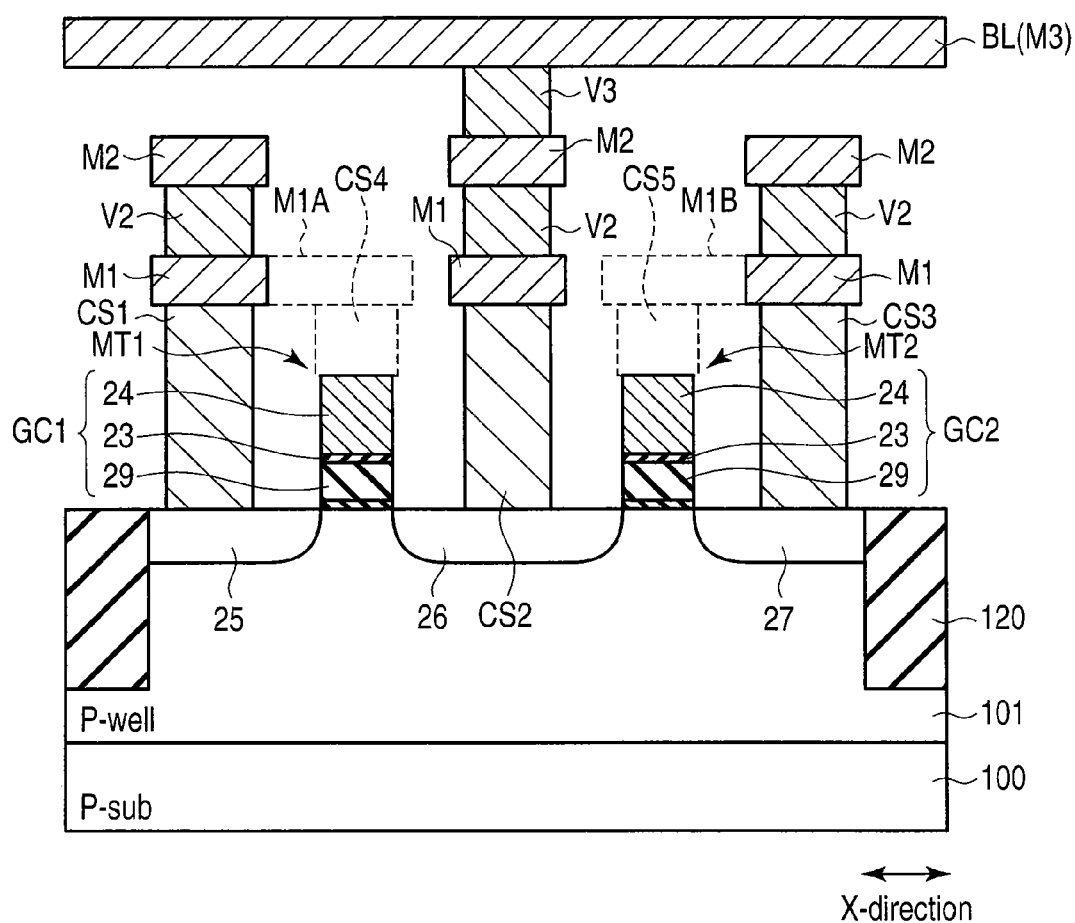

Array switches of the embodiments will be described below in detail with reference to drawings. Elements having the same functions and configurations will be denoted by the same reference numerals or similar ones and details will be described if necessary.

In general, according to one embodiment, a switch unit is provided on a substrate. The switch unit includes first and second switch. The first switch is provided in the switch unit. The first switch includes first and second memory cell transistors and a first pass transistor. The first memory cell transistor is provided in a first active region in the substrate and includes a first source, a first drain, and a first gate. The second memory cell transistor is provided in the first active region adjacent to the first memory cell transistor in a channel length direction of the first memory cell transistor and includes the first drain shared with the first memory cell transistor, a second source, and a second gate. And the first pass transistor is provided in a second active region in the substrate and includes a second drain, a third source, and a third gate connected to the first drain. And a second switch is provided in the switch unit. The second switch includes third and fourth memory cell transistors and a second pass transistor. The third memory cell transistor is provided in the first active region adjacent to the second memory cell transistor in the channel length direction of the first memory cell transistor and includes the second source shared with the second memory cell transistor, a third drain, and a fourth gate. The fourth memory cell transistor is provided in the first active region adjacent to the third memory cell transistor in the channel length direction of the first memory cell transistor and includes the third drain shared with the third memory cell transistor, a fourth source, and a fifth gate. And the second pass transistor is provided in the second active region adjacent to the first pass transistor in the channel length direction of the first pass transistor and includes a fourth drain, a fifth source, and a sixth gate connected to the third drain. The first and second active regions are adjacent to each other in a channel width direction of each transistor.

(1) First Embodiment

A switch array 1 according to the first embodiment will be described using FIGS. 1 to 9.

The switch array 1 in the first embodiment is, for example, a nonvolatile programmable switch array including a switch (for example, called a nonvolatile programmable switch) using a nonvolatile memory element capable of rewriting data.

(a) Circuit Configuration

The circuit configuration of the switch array 1 in the present embodiment will be described using FIG. 1.

FIG. 1 is an equivalent circuit showing the switch array 1 and switches PS1A and PS2A in the present embodiment.

The switch array 1 is used as a multiplexer in FPGA.

The switch array 1 in FIG. 1 has a circuit configuration in which three switch units 10A are arranged in an X-direction. The switch array 1 may be formed by using two switch units or less, or four switch units or more. The switch array 1 may also include a plurality of switch units arranged in a Y-direction crossing the X-direction. The X-direction (first direction) is, for example, an extending direction of a bit line (control line) and the Y-direction (second direction) is perpendicular to the bit line in the present embodiment.

One switch unit 10A includes two switches PS1A and PS2A.

The two switches (first and second switches) PS1A and PS2A in the switch unit 10A are adjacent to each other in the X-direction.

Each of the switches PS1A and PS2A in the present embodiment includes a nonvolatile memory element as a configuration memory and a field-effect transistor as a switch.

The nonvolatile memory elements as a configuration memory are field-effect transistors MT1 and MT2 in a stack gate structure having a charge storage layer. The stack gate structure has a structure in which a control gate is stacked on the charge storage layer on a gate insulating layer. A threshold voltage (on voltage) of the field-effect transistor varies in accordance with the amount of charges in the charge storage layer. That is, if the voltage of a predetermined magnitude is applied to the gate of a transistor, the field-effect transistor is turned on or off in accordance with the amount of charges in the charge storage layer. ON/OFF of a transistor corresponding to some applied voltage and data to be stored are associated. The charge storage layer may be a floating gate electrode or an insulator (for example, silicon nitride) including a trap level like a MONOS (Metal-Oxide-Nitride-Oxide-Semiconductor) or SONOS (Silicon-Oxide-Nitride-Oxide-Semiconductor) structure.

Hereinafter, a field-effect transistor in a stack gate structure as a configuration memory will be called a memory cell transistor. A field-effect transistor as a switch element of the switches PS1A and PS2A will be called a pass transistor.

In each of the switches PS1A, a drain of the memory cell transistor MT1 is connected to the gate of a pass transistor Tr1.

The connection relationship between the two switches PS1A and PS2A in one switch unit 10A is as follows:

A source (first source) SS of the memory cell transistor (first memory cell transistor) MT1 of the switch PS1A is connected to a source of the memory cell transistor (second memory cell transistor) MT2 of the switch PS2A. The two memory cell transistors MT1 and MT2 of one switch unit 10A share the source SS. Hereinafter, the source SS shared by the two memory cell transistors MT1 and MT2 will be called the shared source SS.

The drain (first drain) of the memory cell transistor MT1 is connected to the gate (second gate) of the pass transistor (first pass transistor) Tr1 of the switch PS1A. The drain (third drain) of the memory cell transistor MT2 is connected to the gate (fourth gate) of the pass transistor Tr2 of the switch PS2A.

The gate (first gate) of the memory cell transistor MT1 is connected to a word line (first word line) WL1. The gate (second gate) of the memory cell transistor MT2 is connected to a word line (second word line) WL2.

The shared source of the two memory cell transistors MT1 and MT2 is connected to a bit line (first control line) BL. The bit line extends in the X-direction (first direction).

An interconnect (hereinafter, referred to as a Y-interconnect) YL1 extending in the Y-direction (second direction) is connected to the source (second source) of the memory cell transistor MT1. A Y-interconnect YL2 is connected to the source of the memory cell transistor MT2.

The drain (second drain) of the pass transistor Tr1 and the drain (second drain) of the pass transistor Tr2 are commonly connected to an interconnect (hereinafter, referred to as an X-interconnect) extending in the X-direction.

The memory cell transistors MT1 and MT2 and the pass transistors Tr1 and Tr2 are formed on the same semiconductor substrate (P-type well region) and a potential is supplied to a channel region through a common substrate interconnect (for example, a conductive semiconductor region) Pwell.

In FIG. 1, a diode 90 shows a p-n junction (parasitic diode) formed between an N-type diffusion layer as a drain of the memory cell transistors MT1 and MT2 and a P-type well region. In a plurality of the switch units 10A in the switch array 1, the two memory cell transistors MT1 and MT2 and the two pass transistors Tr1 and Tr2 have the same connection relationships as those described above. However, the word lines WL1 and WL2 connected to the gates of the memory cell transistors MT1 and MT2 are connected to different word lines for each of the memory cell transistors MT1 and MT2 and the Y-interconnects YL1 and YL2 connected to the sources of the pass transistors Tr1 and Tr2 are connected to different Y-interconnects for each of the pass transistors Tr1 and Tr2.

The operation of the switch array 1 will be described.

Operation modes of the switch array 1 include erasing of data from the memory cell transistors MT1 and MT2 (hereinafter, referred to as an erase operation), writing of data to the memory cell transistors MT1 and MT2 (hereinafter, referred to as a write operation), and an operation as a switch (hereinafter, referred to as an FPGA operation).

In the present embodiment, as an erase operation, the switch array 1 puts data holding states (charge storage states) of a plurality of the memory cell transistors MT1 and MT2 in the switch array 1 into erased states (over-erased states) in one operation. Then, as a write operation (program operation), a writing of data operation is performed to each of the memory cell transistors MT1 and MT2 in the switch array 1 to decide the ON state or OFF state of each of the memory cell transistors MT1 and MT2. Depending on whether the memory cell transistors MT1 and MT2 are ON or OFF, the ON state or OFF state of the pass transistors Tr1 and Tr2 connected to the memory cell transistors MT1 and MT2 is decided.

Accordingly, conduction or non-conduction of the interconnects YL and XL connected to the source/drain of the pass transistors Tr1 and Tr2 can be controlled.

The operation of the switch PS1A is mainly illustrated below to describe the operation of the switch array 1 in FIG. 1.

The erase operation of the switches PS1A and PS2A and the switch array 1 will be performed as described below.

In the switch array 1 in which the erase operation should be performed, a voltage of 0 V is applied to the word lines WL1 and WL2 connected to the gates of the memory cell transistors MT1 and MT2, the bit line BL connected to the shared source SS of the memory cell transistors MT1 and MT2 puts into a floating state. Then, an erase voltage is applied to the substrate interconnect Pwell connected to the memory cell transistors MT1 and MT2. The erase voltage is on the order of, for example, 15 V to 20 V.

Then, an electric field applied to a tunnel insulating layer between the gates of the memory cell transistors MT1 and MT2 and the substrate (P-type well region) becomes stronger and electrons in the charge storage layer are emitted to the semiconductor substrate (P-type well region) due to the tunnel effect.

In the switch array 1, as described above, the memory cell transistors MT1 and MT2 and the pass transistors Tr1 and Tr2 are provided on the same substrate (P-type well region). The drains of the memory cell transistors MT1 and MT2 are connected to the gates of the pass transistors Tr1 and Tr2. Therefore, even if the erase voltage is applied to the well region (substrate interconnect Pwell) in the erase operation in the memory cell transistors MT1 and MT2, the voltage applied to the gate insulating layer of the pass transistors Tr1 and Tr2 can be controlled to a sufficiently small voltage due to coupling between the drains of the memory cell transistors MT1 and MT2 and the gates of the pass transistors.

The memory cell transistors MT1 and MT2 that have performed the erase operation have a negative value (less than 0 V) of the threshold voltage. In the present embodiment, a state in which the threshold voltage of the memory cell transistors MT1 and MT2 is negative is called an ON state. The memory cell transistors MT1 and MT2 in the ON state hold, for example, "1" data.

The write operation of the switches PS1A and PS2A and the switch array 1 is performed as described below. Here, a case when data is written into the memory cell transistor MT1 will be described.

When the write operation is performed, 0 V is applied to the substrate interconnect Pwell. Then, the word line WL1 connected to the memory cell transistor MT1 into which data should be written is selected. A positive voltage (write voltage) is applied to the selected word line WL1 to apply the write voltage to the gate of the memory cell transistor MT1 into which data should be written. The write voltage is on the order of, for example, 17 V to 20 V.

The Fowler-Nordheim tunnel effect (FN tunnel effect) is thereby caused so that an FN tunnel current flows between the substrate and the charge storage layer. Therefore, electrons are injected into the charge storage layer (for example, a floating gate) of the memory cell transistor MT1.

At this point, a protective voltage (also called a non-selective voltage) Vpass is applied to the memory cell transistor (for example, the memory cell transistor MT2) into which data is not written via the word line WL2 connected to the gate of the memory cell transistor MT2. The protective voltage Vpass is a voltage to prevent the voltage corresponding to the write voltage from being applied to the gate insulating layer of the non-selective memory cell transistor MT2. The magnitude of the protective voltage Vpass is lower than the write voltage and is set in accordance with write characteristics of the memory cell transistors MT1 and MT2.

The memory cell transistor MT1 that has performed the write operation has a positive threshold voltage (>0). In the present embodiment, a state in which the threshold voltage of a memory cell transistor is positive is called an OFF state. The memory cell transistor into which data has been written holds, for example, "0" data.

The FPGA operation of the switches PS1A and PS2A and the array switch 1 is performed as described below:

The FPGA operation is performed when the switch PS1A is caused to function as a switch block of FPGA after data being written into the memory cell transistor (here, the memory cell transistor MT1) of the switch array 1.

When the FPGA operation of the switch array 1 in the present embodiment operates, the switch array 1 including the switch 10A shown in FIG. 1 selects a Y-interconnect from among a plurality of Y-interconnects YL for the operation. Then, the switch array 1 turns on or off the pass transistors Tr1 and Tr2 based on data (ON/OFF state) stored in the memory cell transistors MT1 and MT2. Accordingly, the switch array 1 controls connection between the X-interconnect XL and the selected Y-interconnect YL1/YL2. The switch array 1 in the present embodiment has such a function.

In the FPGA operation, a Y-interconnect for the operation is selected from among the plurality of Y-interconnects YL. Then, 0 V is applied to all the word lines WL1 and WL2 in the switch array 1 and, for example, a power supply voltage VDD of a logic circuit is applied to the bit line BL.

Then, the memory cell transistors MT1 and MT2 are turned on or off in accordance with information (memory cell threshold voltage) stored in the memory cell transistors MT1 and MT2 respectively.

For example, the memory cell transistor MT1 holds "0" data (positive threshold) and the memory cell transistor MT2 holds "1" data (negative threshold) after the above write operation and erase operation being performed. Therefore, if 0 V is applied to the gate through the word lines WL1 and WL2, the memory cell transistor MT1 is turned off and the memory cell transistor MT2 is turned on.

When the memory cell transistor is turned off like the memory cell transistor MT1, the voltage VDD from the bit line BL is blocked by the memory cell transistor MT1 in the OFF state and thus, the voltage VDD from the bit line BL is not applied to the gate of the pass transistor Tr1. Therefore, the pass transistor Tr1 is not turned on.

Consequently, if the interconnect YL1 is selected, the Y-interconnect YL1 connected to the source thereof is not conducting to the X-interconnect XL connected to the drain thereof, in the pass transistor Tr1 in the OFF state. When the memory cell transistor MT1 is in the OFF state, it is preferable that the voltage applied to the pass transistor Tr1 be substantially 0 V.

When the memory cell transistor is turned on like the memory cell transistor MT2, the voltage VDD is applied to the gate of the pass transistor Tr2 connected to the memory cell transistor MT2 in the ON state. The power supply voltage VDD is, for example, equal to the threshold voltage of the pass transistor Tr2 or more.

The pass transistor Tr2 to which the voltage VDD is applied is turned on. Thus, if the interconnect YL2 is selected, the Y-interconnect YL2 connected to the source in the pass transistor Tr2 to which the power supply voltage VDD is applied is conducting to the X-interconnect XL connected to the drain.

By increasing the voltage applied to the bit line BL, the voltage applied to the gates of the pass transistors Tr1 and Tr2 can be made higher than the power supply voltage VDD. Accordingly, current characteristics of the pass transistors Tr1 and Tr2 can be improved.

As described above, the connection relationship of the interconnects YL and XL can be controlled by turning on/off the memory cell transistors MT1 and MT2 as a configuration memory. Therefore, the switches PS1A and PS2A and the switch array 1 using the switches can be applied to a programmable switch of FPGA.

In the switch array 1, the switch unit 10A, and the switches PS1A and PS2A shown in FIG. 1, the connection relationship between the sources/drains of the pass transistors Tr1 and Tr2 and the interconnects YL and XL is only an example and a switch function that is different from the example in FIG. 1 can naturally be realized by changing the connection relationship between the pass transistors Tr1 and Tr2 and the interconnects YL and XL.

In the switch array 1 in the present embodiment, the memory cell transistors MT1 and MT2 and the pass transistors Tr1 and Tr2 forming the switches PS1A and PS2A are arranged on the substrate (chip) along a channel width direction of the memory cell transistors MT1 and MT2 and the pass transistors Tr1 and Tr2 adjacent to each other.

In the two switches PS1A and PS2A, the source SS of the memory cell transistors MT1 and MT2 connected to the bit line BL is shared by the two memory cell transistors MT1 and MT2.

Accordingly, the switch array 1 in the present embodiment can realize the reduction of occupation area thereof and simplification of interconnect.

(b) Structure

The structure of the switch array 1 in the present embodiment shown in FIG. 1 will be described using FIGS. 2 to 9. Here, FIG. 1 is also used when appropriate to describe the structure of the switch array 1 and switches included therein.

FIG. 2 shows a plane layout of the switches and the switch array 1 in the first embodiment.

FIGS. 3 to 5 show the plane layout of the switch array 1 as appropriate in accordance with the interconnect level. In the present embodiment, the interconnect level indicates the position in the vertical direction (height) with respect to the substrate surface. FIG. 3 mainly shows a layout of active regions provided in the semiconductor substrate, a gate electrode of each transistor, and contact plugs connected to the active regions and the gate electrodes. FIG. 4 mainly shows a layout of interconnect provided at the first interconnect level when counted from the side of the substrate. FIG. 5 shows a layout of interconnect provided at the second and third interconnect levels when counted from the side of the substrate.

Figure 9:
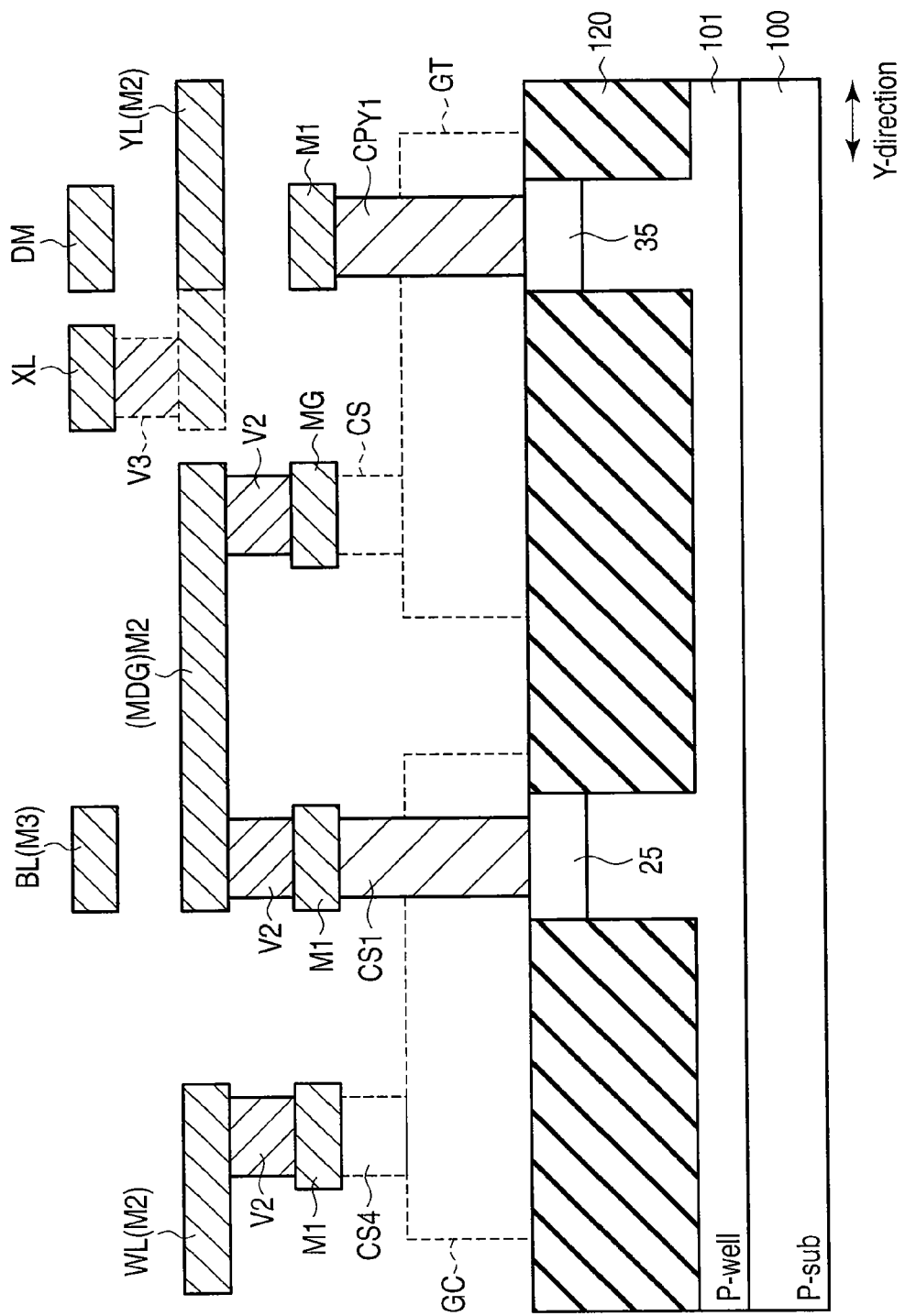

FIG. 6 shows a section structure along a VI-VI line in FIG. 2. FIG. 8 shows a section structure along a VIII-VIII line in FIG. 2. FIG. 9 shows a section structure along an IX-IX line in FIG. 2. In FIG. 9, members in a forward direction or depth direction of the IX-IX line are indicated by broken lines. In FIGS. 6 to 9, the illustration of interlayer insulating layer covering each member is omitted to clarify the illustration. FIGS. 2 to 9 are schematic diagrams and there are regions in which dimensions in the X-direction and dimensions in the Y-direction do not match between FIGS. 2 to 5 (plane views) and FIGS. 6 to 9 (sectional views), which is intended to clarify the illustration, and actual devices are not limited.

As shown in FIG. 2, the switch array 1 includes a plurality (three units in this case) of the switch units 10A. The switch units 10A are arranged along the X-direction. As is described using FIG. 1, one switch unit 10A is formed of the two switches PS1A and PS2A adjacent to each other in the X-direction.

Each of the switches PS1A and PS2A includes one memory cell transistor MT1/MT2 and one pass transistor Tr1/Tr2.

The memory cell transistors MT1 and MT2 and the pass transistors Tr1 and Tr2 forming the switches PS1A and PS2A respectively are formed in a P-type well region (P-type semiconductor area) 101 of a same semiconductor substrate 100.

For example, an area 71 where the memory cell transistors MT1 and MT2 are provided and an area 72 where the pass transistors Tr1 and Tr2 are provided are each set in the semiconductor substrate (chip) 100. The area 71 where the memory cell transistors MT1 and MT2 are provided is called the memory cell transistor area 71 and the area 72 where the pass transistors are provided is called the pass transistor area 72.

On the semiconductor substrate (chip) 100, the memory cell transistor area 71 is adjacent to the pass transistor area 72 in the Y-direction crossing the X-direction.

A plurality of active regions (first semiconductor areas) AA1 is provided in the memory cell transistor area 71. The memory cell transistors MT1 and MT2 are formed in the active regions AA1. The active region AA1 has a rectangular plane shape and all four sides of the active region AA1 in the X-direction and Y-direction are surrounded by an isolation region (isolation insulating layer). The active region AA1 in the memory cell transistor area 71 is also called the memory cell transistor formation region AA1 below.

An active region (second semiconductor area) AA2 is provided in the pass transistor area 72. The active region AA2 extends from one side of the pass transistor area in the X-direction to the other side thereof. That is, the active region AA2 has an oblong (rectilinear) plane shape extending in the X-direction. The active region AA2 in the pass transistor area 72 is also called the pass transistor formation region AA2 below. The active region AA2 is defined in the semiconductor substrate 100 by the isolation region.

The active regions AA1 and AA2 are formed from the P-type well region 101 of the semiconductor substrate 100.

Incidentally, the X-direction of the semiconductor substrate 100 corresponds to the channel length direction of the memory cell transistors MT1 and MT2 and the pass transistors Tr1 and Tr2 and the Y-direction of the chip corresponds to the channel width direction of the memory cell transistors MT1 and MT2 and the pass transistors Tr1 and Tr2.

In FIGS. 2 to 9, contact plugs CS, CS1 to CS5, $CP_{Y1}$, $CP_X$, and $CP_{Y2}$ are provided in the active regions (semiconductor areas) AA1 and AA2 on the semiconductor substrate 100 and on gates GC1, GC2, GT1, and GT2 of transistors. The contact plugs CS, CS1 to CS5, $CP_{Y1}$, $CP_X$, and $CP_{Y2}$ connect the gate electrodes/active regions and interconnect M1 at the first interconnect level when counted from the substrate side. A via plug V1 connects the interconnect M1 and a interconnect M2 which is at the second interconnect level when counted from the substrate side. A via plug V2 connects the interconnect M2 and a interconnect M3 which is at the third interconnect level when counted from the substrate side.

As shown in FIGS. 2, 3, 6, and 9, the two memory cell transistors MT1 and MT2 are provided in one active region AA1 surrounded by an isolation insulating layer 120. The two memory cell transistors MT1 and MT2 provided in the common active region AA1 are the memory cell transistors MT1 and MT2 included in one switch unit 10A.

Gate patterns (gate electrodes) GC1 and GC2 of the two memory cell transistors MT1 and MT2 are provided adjacent to each other in the X-direction in one active region AA1.

In the active region AA1, diffusion layers (drain diffusion layers) 25 and 27 to be drains and a diffusion layer 26 to be a source of each of the memory cell transistors MT1 and MT2 are provided. These two memory cell transistors MT1 and MT2 share one diffusion layer (source diffusion layer) 26(SS) in the active region AA1. The diffusion layer 26 is called the shared source diffusion layer 26. In one active region (memory cell transistor formation region) AA1, the shared source diffusion layer 26 is provided between the two drain diffusion layers 25 and 27.

A gate electrode (also called a gate region or a gate portion) GC1 of the memory cell transistor MT1 is provided in a channel region between the shared source diffusion layer 26 and the drain diffusion layer 25 of the memory cell transistor MT1.

A gate electrode GC2 of the memory cell transistor MT2 is provided in a channel region between the shared source diffusion layer 26 and the drain diffusion layer 27 of the memory cell transistor MT2.

The diffusion layers 25, 26, and 27 are N-type semiconductor regions.

The gate electrodes GC1 and GC2 are pulled from the active region AA1 into the device isolation area (isolation insulating layer 120).

As described above, the memory cell transistors MT1 and MT2 are field-effect transistors in a stack gate structure having the charge storage layer.

The gate electrodes GC1 and GC2 of the memory cell transistors MT1 and MT2 are provided on a gate insulating layer 21 on the semiconductor substrate 100 (P-type well region 101). The gate insulating layer 21 is used as a tunnel insulating layer.

A charge storage layer 22 is provided on the gate insulating layer 21. A control gate electrode 24 is provided on the charge storage layer 22 via an insulator 23. The contact plugs CS4 and CS5 are provided on the control gate electrode 24.

The charge storage layer 22 is, for example, a floating gate electrode 22 made of polysilicon.

In the case of the stack gate structure using the floating gate electrode 22, the insulator 23 between the floating gate electrode 22 and the control gate electrode 24 is called an intergate insulating layer 23.

However, the gate electrodes GC1 and GC2 of the memory cell transistors MT1 and MT2 may have a MONOS (Metal-Oxide-Nitride-Oxide-Semiconductor) structure. That is, as shown in FIG. 7, an insulating layer including the trap level like silicon nitride, for example, is used as a charge storage layer 29 in the memory cell transistors MT1 and MT2 in the MONOS structure. In the case of the stack gate structure using the MONOS structure, the insulator 23 between the charge storage layer 29 and the control gate electrode 24 is called a block insulating layer 23.

In the switch unit 10A, the shared source diffusion layer 26 is connected to a bit line BL1. The bit line BL1 is provided at the third interconnect level when counted from the side of the semiconductor substrate 100. The bit line BL1 extends in the X-direction (in the first direction).

The shared source diffusion layer 26 is connected to the interconnect M1 at the first interconnect level when counted from the side of the semiconductor substrate 100. Further, the interconnect M1 is connected to the bit line BL1 via the via plug V1, the interconnect M2 at the second interconnect level when counted from the substrate side, and the via plug V2.

The word line WL is connected to the gate electrode (control gate electrode) of each of the memory cell transistors MT1 and MT2 via the contact plug CS4 and CS5, the interconnect M1, and the via plug V1. The word line WL is provided at the second interconnect level.

The two word lines WL1 and WL2 in the same switch unit 10A are arranged so as not to be on the same straight line as the gate electrodes GC1 and GC2 in the Y-direction in the memory cell transistors MT1 and MT2 respectively. For example, the two word lines WL1 and WL2 are arranged in the switch unit 10A as if to sandwich the two gate electrodes GC1 and GC2 therebetween in the X-direction. Using the interconnect M1 pulled out in the X-direction from above the gate electrode GC, for example, the word lines WL laid out so as not to be overlapped in the direction perpendicular to the substrate surface is connected to the gate electrode GC. The two interconnects M1 connected to the respective word lines WL1 and WL2 in the switch unit 10A are pulled out in mutually opposite directions in the X-direction.

A diode 90 in FIG. 1 corresponds to a p-n junction formed of the P-type well region 101 and the N-type diffusion layer 25.

The active region AA2 is adjacent to the active region AA1 in the Y-direction. That is, the memory cell transistors MT1 and MT2 and the pass transistors Tr1 and Tr2 are adjacent to each other in the Y-direction (channel width direction).

The pass transistor formation region AA2 is continuous in the X-direction without being separated for each of the transistors Tr1 and Tr2 or each of the switch units 10A. One active region AA2 is shared by a plurality of pass transistors in the switch array 1.

When the switch array 1 operates, like the above operation, a Y-interconnect is selected from among the plurality of Y-interconnects YL. That is, only one pass transistor is used for FPGA operation of the switch array 1. A plurality of pass transistors shares the X-interconnect XL and thus, the FPGA operation of the switch array 1 is not adversely affected even if the memory cell transistors MT1 and MT2 connected to the non-selected Y-interconnect YL are turned on or off. Therefore, the plurality of pass transistors Tr1 and Tr2 can be provided in the common active region AA2 without separating the active region AA2 of the pass transistors Tr1 and Tr2 by an insulating layer.

As shown in FIGS. 2 to 4 and 8, the gate electrodes GT1 and GT2 of the pass transistors Tr1 and Tr2 are formed by connecting multiple (herein two) gate patterns (called gate regions, gate fingers or electrodes) $31_1$, $31_2$, $32_1$, and $32_2$ in series using a first interconnect MG when counted from the substrate side.

Accordingly, the effective channel width (gate width) of the pass transistors Tr1 and Tr2 is increased and a current driving force of the pass transistors Tr1 and Tr2 is improved. Each of the gate electrode regions (gate fingers) $31_1$, and $31_2$ is connected to the interconnect (called the gate interconnect) MG via the contact plug CS on the gate electrode regions $31_1$, and $31_2$. Thus, the gate electrodes of the pass transistors Tr1 and Tr2 are formed of two gate patterns (gate electrode regions).

The dimension of each of the gate electrode regions $31_1$ and $31_2$ in the channel length direction is the same as that of, for example, the gate electrodes GC1 and GC2 of the memory cell transistors MT1 and MT2 in the channel length direction. Incidentally, the dimension of the active region AA1 and that of the active are AA2 in the X-direction may be the same or may be different.

A diffusion layer 36 provided in the semiconductor substrate 100 (P-type well region 101) between the two gate electrode regions $31_1$, and $31_2$ forming the gate electrodes GT is connected to the Y-interconnect YL via the contact plug $CP_{Y1}$, the interconnect M1, and the via plug V1. The diffusion layer 36 connected to the Y-interconnect YL is used as the source diffusion layer 36 of the pass transistors Tr1 and Tr2. The Y-interconnect YL is positioned at the second interconnect level when counted from the substrate side and is formed by using the interconnect M2 provided at the interconnect level thereof. The Y-interconnect YL extends in the Y-direction.

In the extension direction (X-direction) of the active region AA2, two diffusion layers 35 and 37 are arranged in the active region AA2 as if to sandwich the two gate electrode regions $31_1$, and $31_2$ and one diffusion layer 36 therebetween.

The two diffusion layers 35 and 37 are connected to the X-interconnect XL via the contact plug $CP_X$, the two interconnects M1 and M2, and the two via plugs V1 and V2. The X-interconnect XL is positioned at the third interconnect level when counted from the substrate side. The X-interconnect XL extends in the X-direction.

The diffusion layers 35 and 37 connected to the X-interconnect XL are used as the drain diffusion layers of the pass transistors Tr1 and Tr2. With the gate electrodes of the pass transistors Tr1 and Tr2 configured to be connected to two gate patterns (gate electrode portions), the diffusion layers 35 and 37 of one pass transistor Tr1/Tr2 are configured to be divided into two diffusion layers in the active region AA2.

As shown in FIG. 1, the drains of the memory cell transistors MT1 and MT2 are connected to the gates of the pass transistors Tr1 and Tr2.

Thus, as shown in FIGS. 2 and 9, the drain diffusion layer 25 of the memory cell transistor MT1 is connected to the gate electrodes GT of the pass transistors Tr1 and Tr2 via a interconnect MDG provided at the second interconnect level. The contact plug CS1, the interconnect M1 at the first interconnect level, and the via plug V2 are provided between the drain diffusion layer 25 of the memory cell transistors MT1 and MT2 and the interconnect MDG. The interconnect connecting the drain diffusion layer 25 of the memory cell transistors MT1 and MT2 and the gate electrode GT1 of a pass transistor is also called a drain-gate interconnect MDG.

The drain diffusion layer 25 is not arranged in the same straight line as the gate electrode GT1 of the pass transistors Tr1 and Tr2 in the Y-direction. Thus, the gate-drain interconnect MDG is connected to the gate interconnect MG to connect the two gate electrode regions $31_1$ and $31_2$ of the pass transistors Tr1 and Tr2. The gate interconnect MG of the pass transistor Tr1 and the drain diffusion layer 25 of the memory cell transistor MT1 are laid out to be arranged in the same straight line in the Y-direction. Accordingly, the plane shape of the gate-drain interconnect MDG can be made substantially linear, making complex patterning and processing unnecessary.

For example, the gate-drain interconnect MDG is provided at the same interconnect level as the word line WL. The gate-drain interconnect MDG is laid out to be arranged in the same straight line as the word line WL in the Y-direction.

The bit line BL and the X-interconnect XL are provided at the third interconnect level when counted from the substrate side and are formed of an interconnect at the interconnect level thereof.

The gate electrodes (gate electrode regions, the long side of the gate fingers) $31_1$ and $31_2$ of the pass transistors Tr1 and Tr2 are provided on the substrate 100 so as to be arranged in the same straight line as the gate electrodes GC1 and GC2 of the memory cell transistors MT1 and MT2 in the Y-direction. The gate electrodes (gate electrode regions) of the plurality of pass transistors Tr1 and Tr2 are provided on the semiconductor substrate (active region) at predetermined intervals in the X-direction in one active region AA2.

Here, a layout in which patterns whose plane shape is oblong (for example, rectangular) are arranged is called a line and space. However, the line-and-space layout is not limited to gate patterns and is also applied to interconnect patterns. In a line-and-space layout of interconnect pattern, a substantially linear interconnect pattern (line) extending in some direction (X- or Y-direction) is arranged with an interval (space) in a direction crossing the extension direction thereof.

In the present embodiment, a plurality of gate patterns provided on the substrate has a line-and-space layout. Accordingly, processing of a plurality of gate electrodes and interconnects is made relatively easy.

In the switch array 1 in the present embodiment, the active regions AA1 and AA2 in which the memory cell transistors MT1 and MT2 and the pass transistors Tr1 and Tr2 in one switch PS1A/PS2A are provided adjacent to each other in the channel width direction (Y-direction here) sandwiching an isolation insulating layer therebetween. The memory cell transistors MT1 and MT2 and the pass transistors Tr1 and Tr2 are arranged on the substrate adjacent to each other in the channel width direction. The gate electrodes GC1 and GC2 of the memory cell transistors MT1 and MT2 are arranged in the same straight line as the gate electrodes (gate electrode regions) of the pass transistors Tr1 and Tr2.

The two memory cell transistors MT1 and MT2 in the common switch unit 10A are adjacent to each other in the channel length direction in one active region AA1. By using such a layout, the source diffusion layer 26(SS) of the adjacent memory cell transistors MT1 and MT2 can be shared and a contact CS2 connected to the bit line BL can also be shared.

Moreover, the size (cell size) of each of the memory cell transistors MT1 and MT2 can be made smaller and an occupation area (area of the memory cell transistor area 71) of the plurality of memory cell transistors MT1 and MT2 included in the switch array 1 can be made smaller.

With the memory cell transistors MT1 and MT2 and the pass transistors Tr1 and Tr2 adjacent to each other in the channel width direction in one switch like in the present embodiment, when compared with a case in which memory cell transistors MT1 and MT2 and the pass transistors are adjacent to each other in the channel length direction, the shape and layout of interconnects connecting between transistors can be made simpler. According to the present embodiment, for example, the number of interconnect levels can be reduced by one.

The switch array 1 in the present embodiment has a line-and-space layout and gate electrodes of transistors are arranged on the substrate.

Generally, a cutting-edge LSI process requires huge process costs because of minimum-dimensional processing and processing of complex shapes for higher integration.

On the other hand, a line-and-space layout like in the present embodiment can significantly reduce process costs. Thus, in consideration of total costs to form a semiconductor integrated circuit, the layout using a line and space is advantageous.

As described above, the switch array 1 and the switches PS1A and PS2A in the first embodiment can provide the switch array 1 with a smaller occupation area.

Therefore, the switch array 1 and the switches PS1A and PS2A in the first embodiment can make the occupation area thereof smaller by having the above circuit and layout.

(2) Second Embodiment

A switch array 2 in the second embodiment will be described using FIGS. 10 to 15. In the present embodiment, the same reference numerals are attached to the same members as those in the first embodiment and a description of the same members in the first embodiment as those of the switch array 2 is provided if necessary. Regarding effects similar to those in the first embodiment, a description thereof is omitted.

(a) Circuit Configuration

The circuit configuration of the switch array 2 in the second embodiment will be described using FIG. 10.

Figure 10:
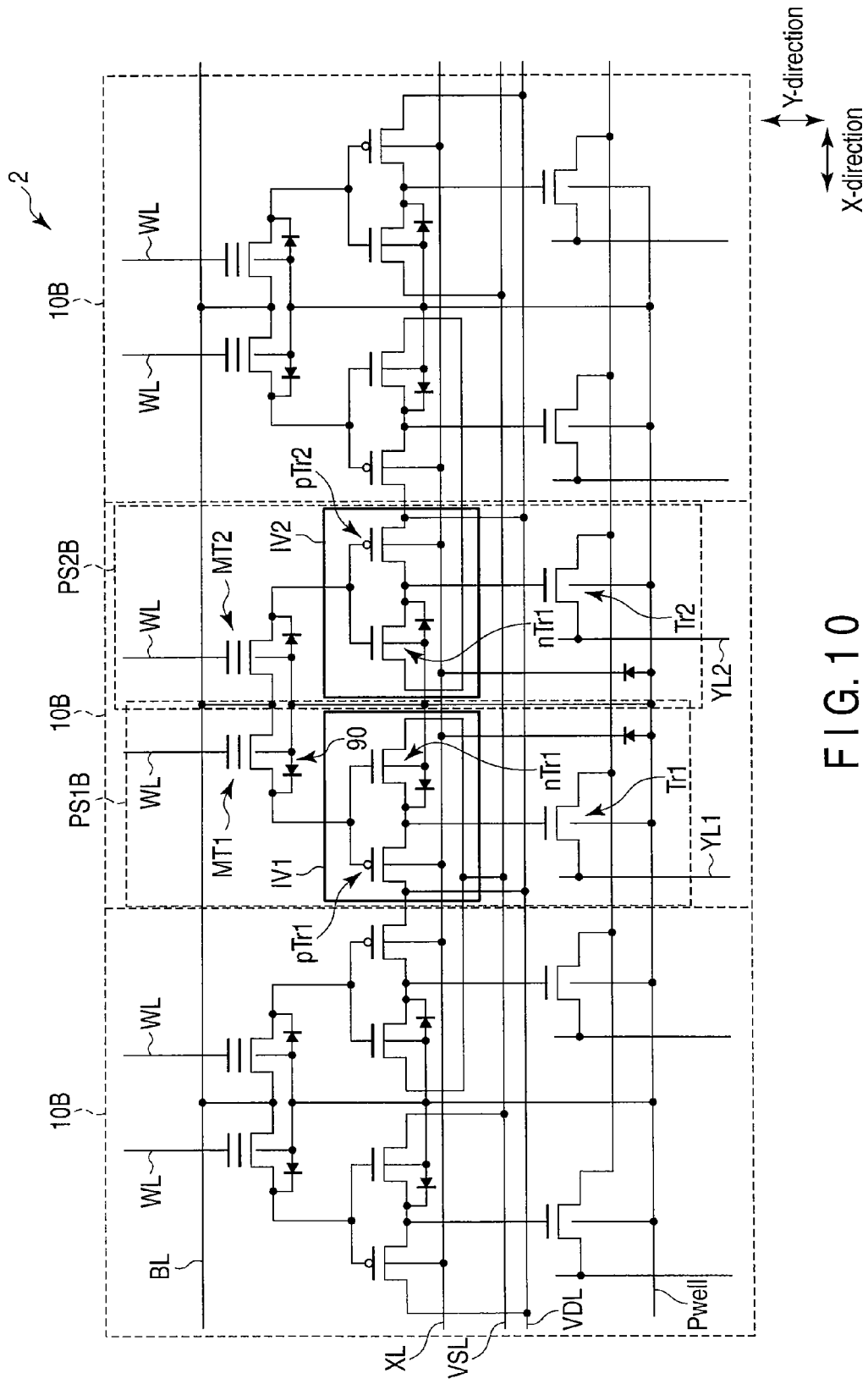
FIG. 10 is an equivalent circuit diagram of a switch array according to a second embodiment.

FIG. 10 is an equivalent circuit diagram showing the circuit configuration of the switch array 2 in the second embodiment.

Like in the first embodiment, a switch unit 10B in the switch array 2 includes two switches (first and second switches) PS1B and PS2B.

In the present embodiment, as shown in FIG. 10, the switches PS1B and PS2B further includes inverters IV1 and IV2. The inverters IV1 and IV2 are CMOS inverters. That is, one inverter IV1/IV2 is formed of one p-channel MOS transistor PT1/PT2 and one n-channel MOS transistor NT1/NT2.

In the present embodiment, drains of the memory cell transistors MT1 and MT2 are connected to input nodes of the inverters IV1 and IV2. Then, output nodes of the inverters IV1 and IV2 are connected to gates of the pass transistors Tr1 and Tr2.

Thus, the switches PS1B and PS2B in the present embodiment are different from those in the first embodiment in that the drains of the memory cell transistors MT1 and MT2 are connected to the gates of the pass transistors Tr1 and Tr2 via input/output nodes of the inverters IV1 and IV2.

In the present embodiment, when the memory cell transistors MT1 and MT2 are in an ON state, a supply potential from the bit line BL is applied to the gates of the pass transistors Tr1 and Tr2 via the inverters IV1 and IV2.

In each of the switches PS1B and PS2B, with the inverters IV1 and IV2 being inserted between the memory cell transistors MT1 and MT2 and the pass transistors Tr1 and Tr2 respectively, even if the voltage applied to the memory cell transistors MT1 and MT2 is not in full swing to a High side (VDD side) or Low side (Vss side), the voltage applied to the gate electrodes of the pass transistors Tr1 and Tr2 can be made a value in full swing to the High side or Low side by the amplification of the inverters IV1 and IV2.

If the voltage applied to the gate electrodes of the pass transistors Tr1 and Tr2 should be made higher than the power supply voltage VDD to improve characteristics of the pass transistors Tr1 and Tr2 such as improvement of current characteristics, the power supply voltage applied to the source of the p-channel MOS transistor of the inverters IV1 and IV2 may be increased.

The operation of the switch array 2 in the second embodiment will be described. Like in the first embodiment, operation modes of the switch array 2 include the erase operation of the memory cell transistors MT1 and MT2, the write operation of the memory cell transistors MT1 and MT2, and the FPGA operation as a switch.

The erase operation and write operation of the memory cell transistors MT1 and MT2 are the same as those in the first embodiment and thus omitted.

The FPGA operation is performed when the switch array 1 is caused to function as a switch block of FPGA after data being written into the memory cell transistor MT1/MT2 in the switch array 2.

In the FPGA operation, 0 V is applied to all word lines and the power supply voltage VDD is applied to the bit line BL. Then, the memory cell transistors MT1 and MT2 are turned on or off in accordance with information written into the memory cell transistors MT1 and MT2 respectively.

When the memory cell transistor MT1/MT2 is turned on, the power supply voltage VDD is applied to the input node (transistor gate) of the inverter IV1/IV2. The voltage applied to the gate of the pass transistor Tr1/Tr2 becomes 0 V if the drive voltage of the inverter IV1/IV2 is set to the same magnitude as that of the power supply voltage VDD of a logic circuit.

When the memory cell transistor MT1/MT2 is turned off, the 0 V is substantially applied to the input node of the inverter IV1/IV2. The voltage applied to the gate of the pass transistor Tr1/Tr2 becomes the power supply voltage VDD if the drive voltage of the inverter IV1/IV2 is set to the same magnitude as that of the power supply voltage VDD of a logic circuit.

Thus, ON/OFF of the pass transistors Tr1 and Tr2 are controlled via the inverters IV1 and IV2.

(b) Structure

The structure of the switch array 2 in the second embodiment will be described using FIGS. 11 to 15.

Figure 11:
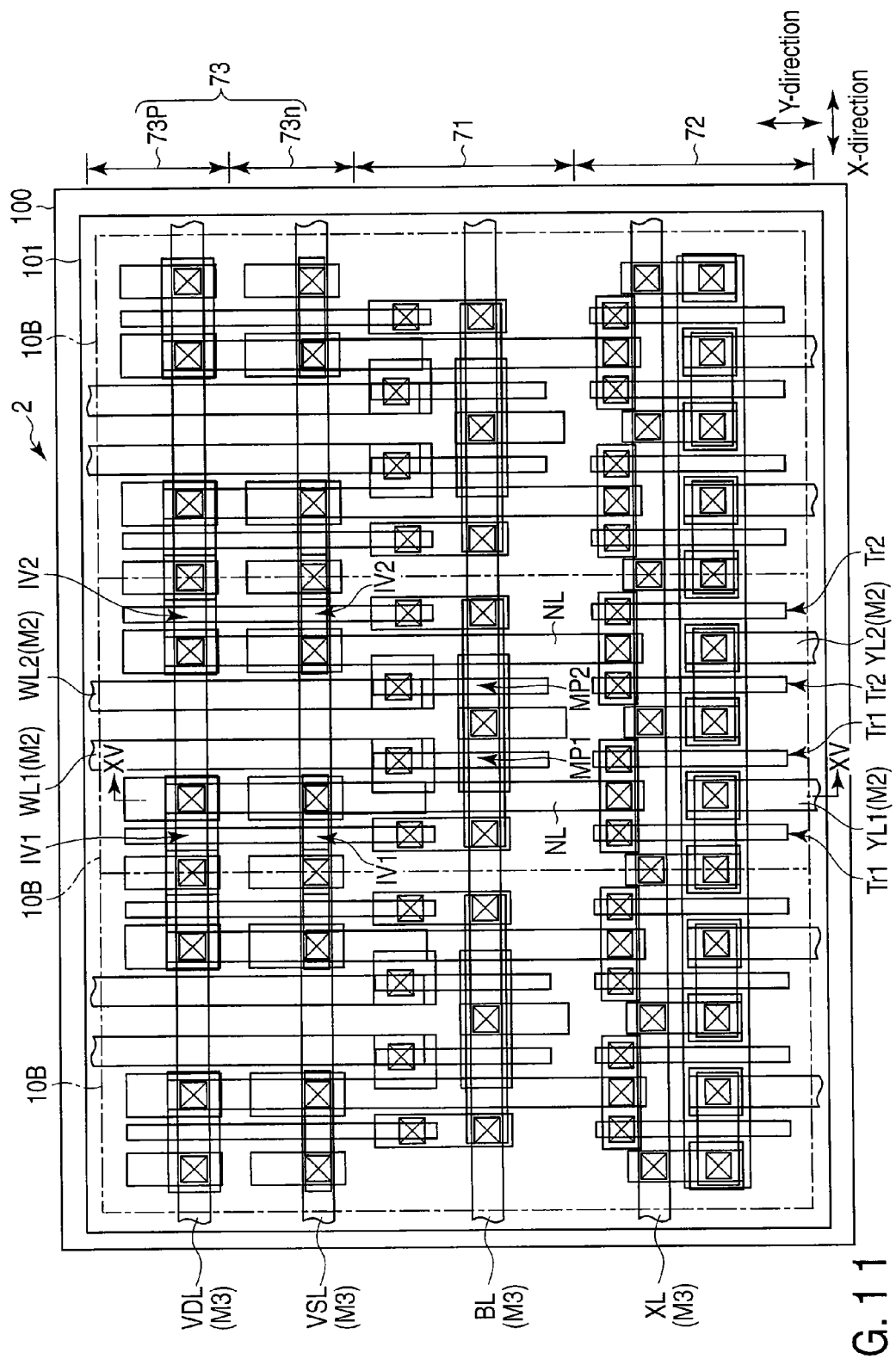
FIGS. 11 to 14 are plane views of the switch array according to the second embodiment.
Figure 12:
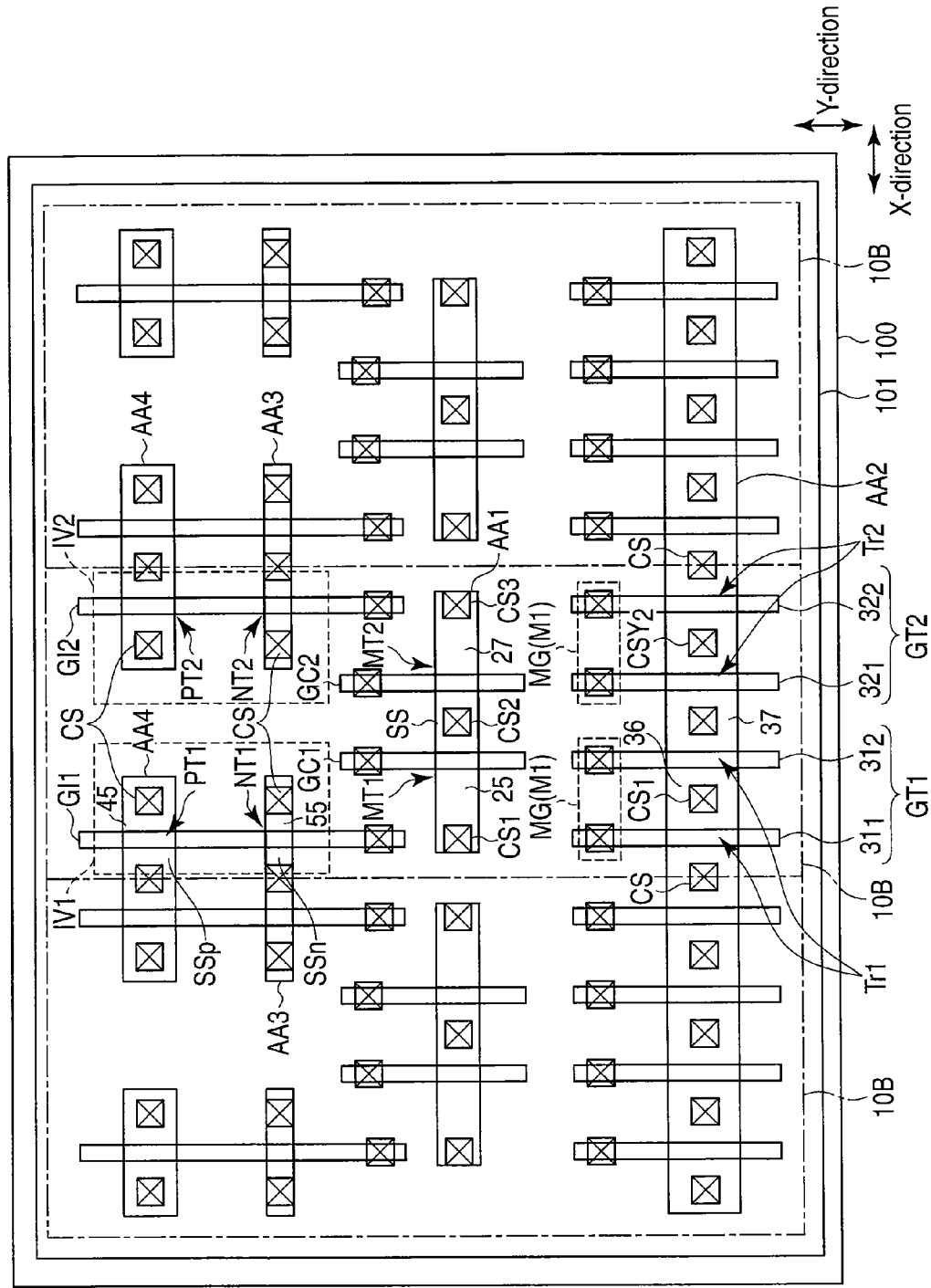
Figure 13:
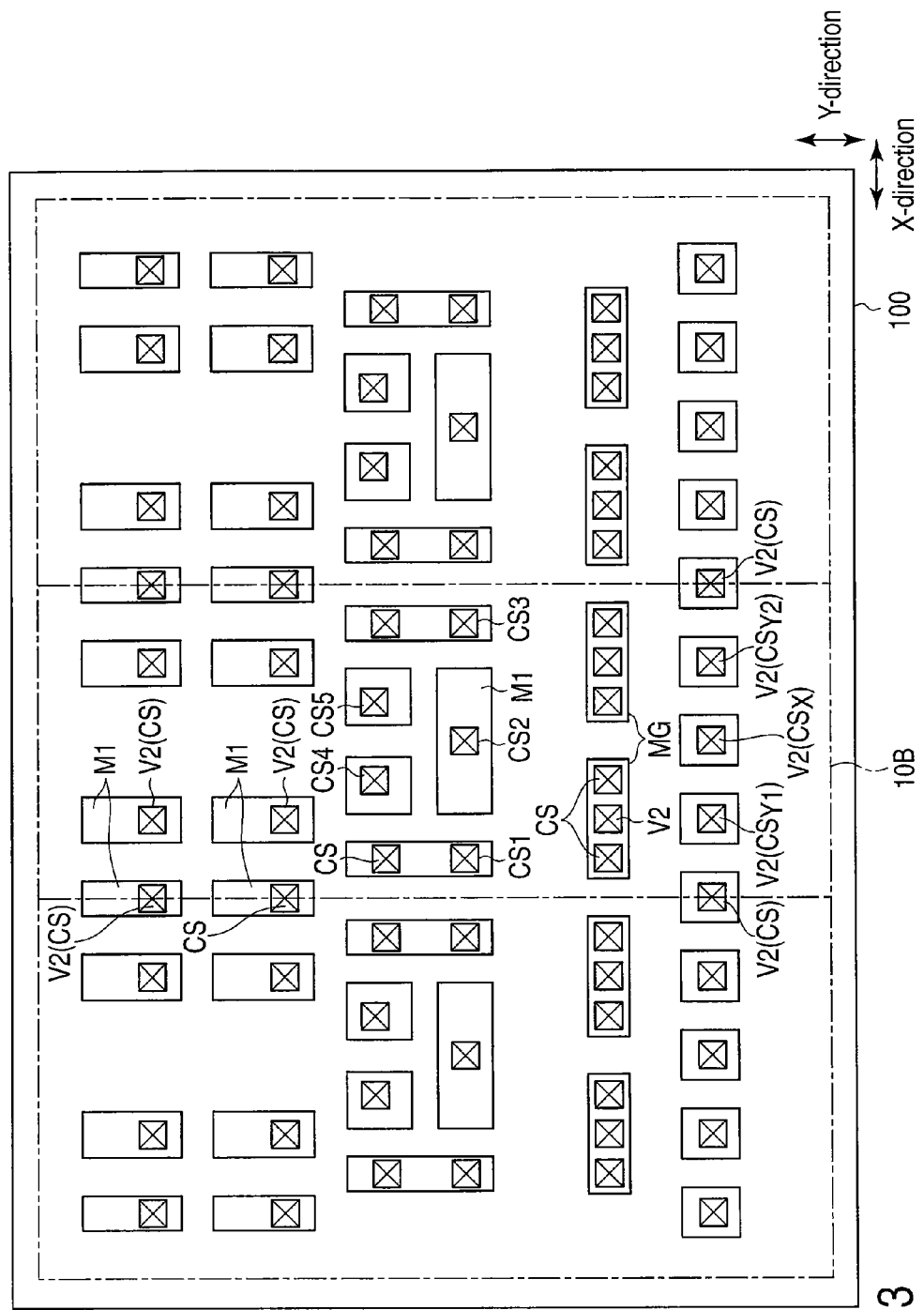
Figure 14:
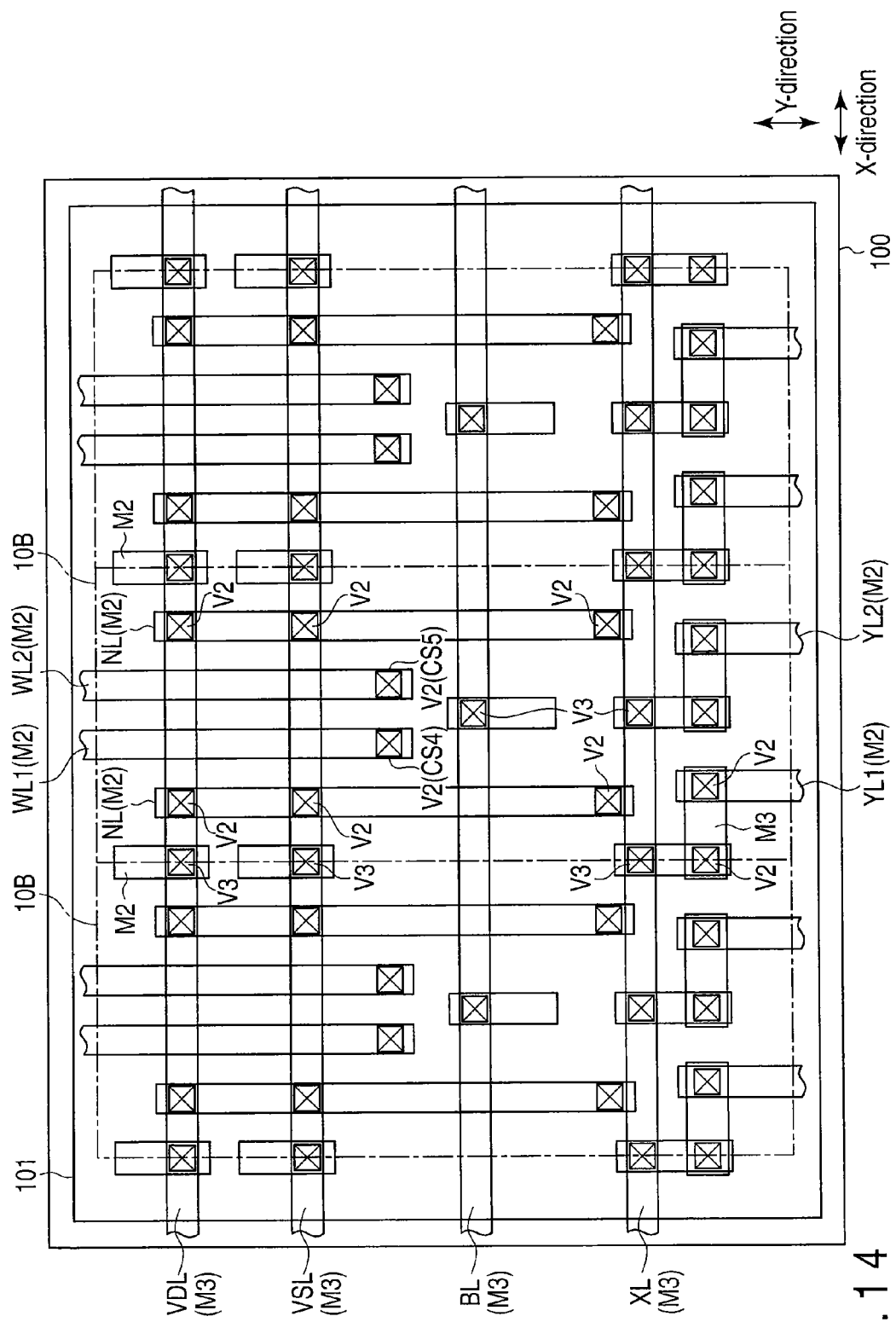

FIG. 11 shows a plane layout of the switch array 2 and the switches PS1B and PS2B in the second embodiment. FIGS. 12 to 14 show the plane layout of the switch array 2 as appropriate in accordance with the interconnect level.

FIG. 12 mainly shows a layout of active regions provided in the semiconductor substrate, a gate electrode of each transistor, and contact plugs connected to the active regions and the gate electrodes. FIG. 13 mainly shows a layout of interconnect provided at the first interconnect level. FIG. 14 shows a layout of interconnect provided at the second and third interconnect levels.

Figure 15:
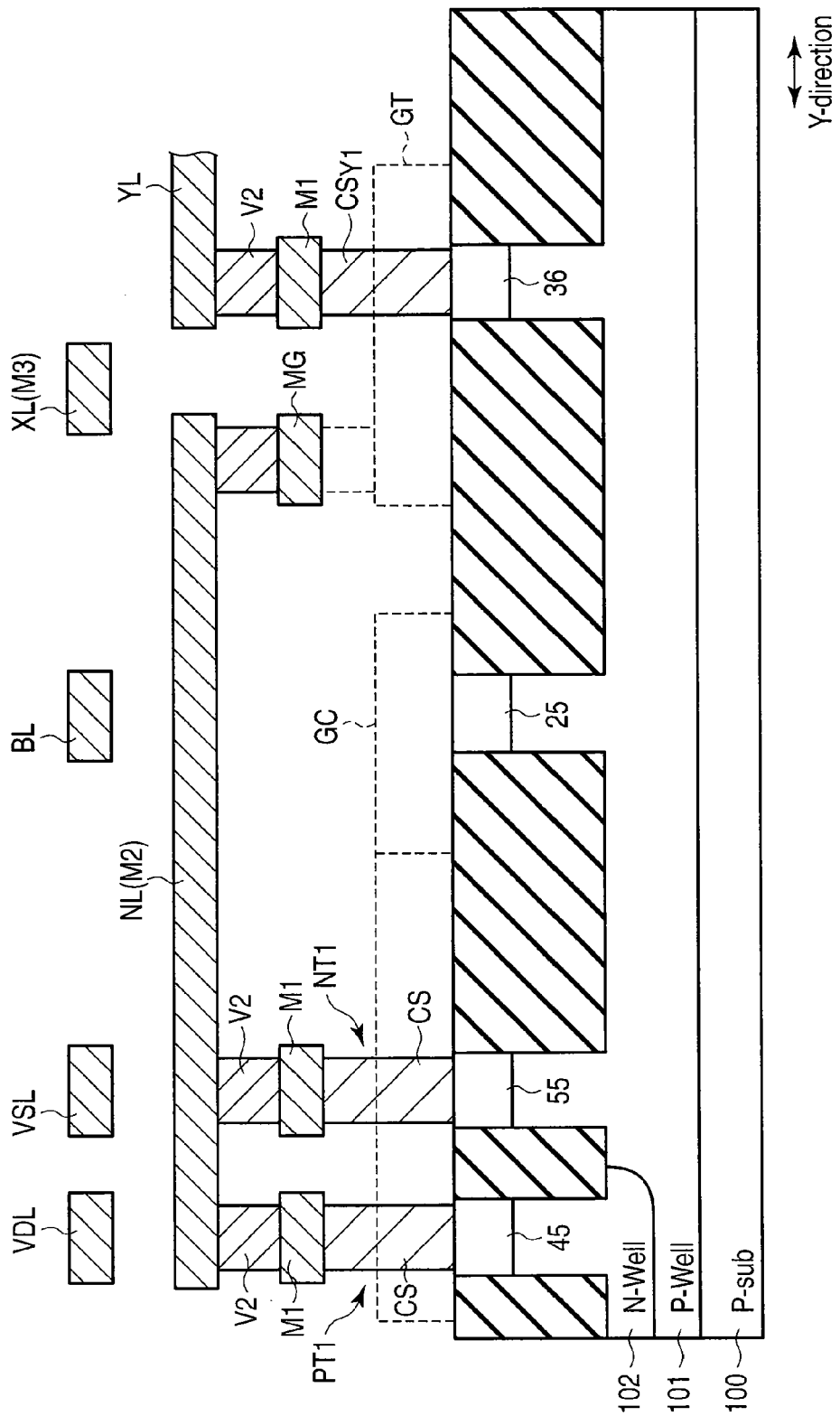
FIG. 15 is sectional view of the switch array according to the second embodiment.

FIG. 15 shows a section structure along an XV-XV line in FIG. 11. In FIG. 15, members in a forward direction or depth direction of the XV-XV line are indicated by broken lines. In FIG. 15, the illustration of interlayer insulating layers covering each member is omitted to clarify the illustration. FIGS. 11 to 15 are schematic diagrams and dimensions in the X-direction and dimensions in the Y-direction do not match between FIG. 11 (plane view) and FIG. 15 (sectional view), which is intended to clarify the illustration and does not apply naturally to actual devices.

As described above, each of the switches PS1B and PS2B in the switch array 2 includes one nonvolatile configuration memory (memory cell transistor) MT1/MT2, one inverter IV1/IV2, and one pass transistor Tr1/Tr2. The two switches PS1B and PS2B adjacent to each other in the X-direction forms one switch unit 10B. The switch array 2 shown in FIGS. 11 to 15 includes three switch units 10B.

In the present embodiment, an area 73 (called an inverter area) in which the inverters IV1 and IV2 are provided is provided adjacent to the memory cell transistor area 71 in the Y-direction. Further, in the inverter area 73, an area (called a p-channel transistor area) 73p in which a p-channel MOS transistor is provided and an area (called an n-channel transistor area) 73n in which an n-channel MOS transistor is provided are respectively provided.

The p-channel transistor area 73p and the re-channel transistor area 73n are adjacent to each other in the Y-direction.

The p-channel transistor area 73p includes a plurality of active regions (also called a p-channel transistor formation region) AA4 arranged in the X-direction. The n-channel transistor area 73n includes a plurality of active regions (also called a n-channel transistor formation region) AA3 arranged in the X-direction. As shown in FIG. 15, the active regions AA4 of the p-channel transistor area 73p are formed from an N-type well region and the active regions AA3 of the n-channel transistor area 73n are formed from a P-type well region.

The chip 100 has a layout in which the memory cell transistor area 71 is sandwiched between the pass transistor area 72 and the inverter area 73 in the Y-direction.

Regarding the memory cell transistor area 71 and the inverter area 73, the memory cell transistor area 71 uses the P-type well region as an active region and thus, it is preferable that the memory cell transistor area 71 be adjacent to the n-channel transistor area 73n formed of the P-type well region from the standpoint of stabilization of circuit operation and processes.

Two n-channel MOS transistors NT1 are provided in the active region AA3. The two n-channel transistors NT1 provided in the common active region AA3 are each used by mutually different switch units 10B.

Two p-channel MOS transistors PT1 are provided in the active region AA4. The two p-channel transistors PT1 provided in the common active region AA4 are each used by mutually different switch units 10B.

In the present embodiment, the two inverters IV1 and IV2 in one switch unit 10B are not formed in a common active region. Each of the inverters IV1 and IV2 shares the active regions AA3 and AA4 with the inverters IV1 and IV2 in the two adjacent switch units 10B in mutually opposite directions.

Thus, the two adjacent switch units 10B share the active regions AA3 and AA4 to arrange the n-channel/p-channel transistors of the inverters IV1 and IV2. Accordingly, the area of the switch array 2 can be reduced.

Section structures of the n-channel/p-channel transistors NT1, NT2, PT1, and PT2 forming the inverters IV1 and IV2 in the channel length direction are different only in layout of interconnect and are substantially the same as those of the memory cell transistors MT1 and MT2 and the pass transistors Tr1 and Tr2 in the channel length direction. Thus, a description about the section structures of the n-channel/p-channel transistors NT1, NT2, PT1, and PT2 forming the inverters IV1 and IV2 in the channel length direction is omitted.

The n-channel transistors NT1 and NT2 and the p-channel transistors PT1 and PT2 forming one inverter IV1/IV2 share gate electrodes (called common gate electrodes) GI1 and GI2. Thus, the gate electrodes GT1 and GI2 of two transistors forming the inverters IV1 and IV2 extend in the Y-direction, and are arranged on the semiconductor substrate 100 as if to straddle the two adjacent active regions AA3 and AA4 in the Y-direction.

Therefore, it is preferable to arrange the active region AA3 where the n-channel transistor is provided to be adjacent in the Y-direction to the active region AA4 where the p-channel transistor is provided on the semiconductor substrate 100. Accordingly, the common gate electrodes GI1 and GI2 shared by the n-channel transistors NT1 and NT2 and the p-channel transistors PT1 and PT2 can be formed from a linear pattern (line pattern) for each of the inverters IV1 and 1V2.

The common gate electrodes GI1 and GI2 are used as input nodes of the inverters IV1 and 1V2.

If, like the present embodiment, the common gate electrodes GI1 and GI2 as input nodes of the inverters IV1 and 1V2 are shared by the n-channel transistors NT1 and NT2 and the p-channel transistors PT1 and PT2, dimensions of the active are AA3 and the active are AA4 in the Y-direction (channel width direction of transistors) may mutually be different to adjust current drive of the n-channel transistors NT1 and NT2 and the p-channel transistors PT1 and PT2.

The common gate electrodes GI1 and GI2 as input nodes of the inverters IV1 and IV2 are connected to the drain diffusion layers 25 and 27 of the memory cell transistors MT1 and MT2 via the contact plugs CS1 and CS3 and the interconnect M1 at the first interconnect level.

Accordingly, in the FPGA operation, the voltage from the bit line BL is applied to the common gate electrodes GI1 and GI2 in accordance with the ON/OFF state of the memory cell transistors MT1 and MT2.

As shown in FIG. 15, drain diffusion layers 55 and 45 of the n-channel transistor NT1 and the p-channel transistor PT1 as output nodes of the inverters IV1 and IV2 are connected to a interconnect (called a node interconnect) NL at the second interconnect level. The node interconnect NL is connected to the gate interconnect MG to form the gate electrodes GT1 and GT2 of the pass transistors Tr1 and Tr2 via the intermediate interconnect M1 and the plug V1.

When viewed from the direction perpendicular to the substrate surface, the node interconnect NL is arranged between the common gate electrodes GI1 and GI2 of the inverters IV1 and IV2 and the gate electrodes GC1 and GC2 of the memory cell transistors MT1 and MT2. The node interconnect NL extends in the Y-direction from the inverter area 73 to pass transistor area 72 via the memory cell transistor area 71. The node interconnect NL has a linear plane shape. The node interconnect NL is in the same straight line as the Y-interconnect YL in the Y-direction at the second interconnect level (M2).

As shown in FIG. 11, like in the first embodiment, gate electrodes of one pass transistor Tr1/Tr2 are formed by using the two gate electrode regions $31_1$, $31_2$, $32_1$, and $32_2$ connected via the gate interconnect MG. The two gate electrode regions $31_1$, $31_2$, $32_1$, and $32_2$ are adjacent to each other in the Y-direction. One gate electrode regions $31_2$ and $32_1$ (the long side of the gate fingers) are arranged in the same straight line as the gate electrodes GC1 and GC2 of the memory cell transistors MT1 and MT2 in the Y-direction. The other gate electrode regions $31_1$ and $32_2$ are arranged in the same straight line as the common gate electrodes GI1 and GI2 of the p-channel/n-channel transistors forming the inverters IV1 and IV2 in the X-direction.

Common source diffusion layers SSp and SSn of the inverters IV1 and IV2 provided in the same active regions AA3 and AA4 are connected to a power supply line VDL and a ground line VSL respectively.

The common source diffusion layer SSp is provided in the active region AA4 and shared by the two p-channel transistors PT1 in the same active region AA4. The common source diffusion layer SSp is connected to the power supply line VDL via a plug and an interconnect.

The common source diffusion layer SSn is provided in the active region AA3 and shared by the n-channel transistors in the same active region AA3. The common source diffusion layer SSn is connected to the ground line VSL via a plug and an interconnect.

The power supply line VDL is an interconnect to apply the power supply voltage VDD to the inverters IV1 and IV2. The ground line VSL is an interconnect to apply a ground voltage VSS to the inverters IV1 and IV2.

The ground line VSL extends in the X-direction above the active region AA3 forming the n-channel transistors of the inverters IV1 and IV2.

The power supply line VDL, the ground line VSL, the bit line, and the X-interconnect XL are provided, for example, at the same interconnect level and arranged at the interconnect level in a line-and-space layout at predetermined intervals in the Y-direction.

The two word lines WL are arranged between gates of the two inverters IV1 and IV2 that do not share the active region AA3 and AA4. The word lines WL are provided at the second interconnect level. Thus, the word lines WL intersect with the power supply line VDL and the ground line VSL sandwiching an interlayer insulating layer therebetween.

The switch array 2 in the present embodiment further includes, as described above, the inverters IV1 and IV2, in addition to the memory cell transistors MT1 and MT2 and the pass transistors Tr1 and Tr2.

In the different switch units 10B adjacent to each other, two n-channel transistors NT1 forming the inverters IV1 and IV2 respectively share one active region AA3 and two p-channel transistors PT1 forming the inverters IV1 and IV2 respectively share one active region AA4.

Each plug, CS, V1, and V2 connected to the common source diffusion layers SSn and SSp of the transistors NT1, PT1, NT2, and PT2 forming the inverters IV1 and IV2 and diffusion layers thereof are shared by the inverters IV1 and IV2 of the two switch units 10B adjacent to each other. Thus, the diffusion layers SSn and SSp of the transistors NT1, PT1, NT2, and PT2 forming the inverters IV1 and IV2 and the contact plug CS can be shared and thus, the occupation area of the switch array 2 and the switches PS1B and PS2B can be made smaller without making the layout of interconnect complex.

Further, the common source diffusion layer 26 (SS) of the memory cell transistors MT1 and MT2 and the common source diffusion layers SSp and SSn of the inverters IV1 and IV2 are laid out on mutually opposite sides sandwiching gate electrodes therebetween. Accordingly, dense interconnect in the switch array 2 can be avoided and numbers of interconnects and interconnect levels to form the switch array 2 can be controlled.

Like in the first embodiment, the source 26 (SS) of the adjacent memory cell transistors MT1 and MT2 can be shared and the two memory cell transistors MT1 and MT2 can share the contact CS2 that connects the bit line BL and the memory cell transistors MT1 and MT2. Thus, the occupation area of the memory cell transistor area 71 can be made smaller.

In the switch array 2, the gate electrode GC1 of the memory cell transistor MT1 and a region (gate pattern) $31_2$ of the gate electrode GT1 of the pass transistor Tr1 are arranged along the channel width direction (Y-direction) of the transistors. The common gate electrodes GI1 and GI2 of the n-channel/p-channel transistors as input nodes of the inverters IV1 and IV2 are arranged along the channel width direction together with the gate electrodes (gate electrode regions) of the pass transistors Tr1 and Tr2. Thus, when, like in the present embodiment, the inverters IV1 and IV2 are included in the switches PS1B and PS2B, the gate pattern of each transistor can be formed on a substrate in a line-and-space layout. Therefore, manufacturing costs of the switch array 2 can be reduced.

According to the switch array 2 in the second embodiment, as described above, like in the first embodiment, the area of the switch array 2 can be made smaller.

(3) Third Embodiment

A switch array 3 in the third embodiment will be described using FIGS. 16 to 25. In the present embodiment, the same reference numerals are attached to the same members as those in the first and second embodiments and a description of the same members in the first and second embodiments as those of the switch array 3 is provided if necessary. Regarding effects similar to those in the first and second embodiments, a description thereof is omitted.

(a) Circuit Configuration

Figure 16:
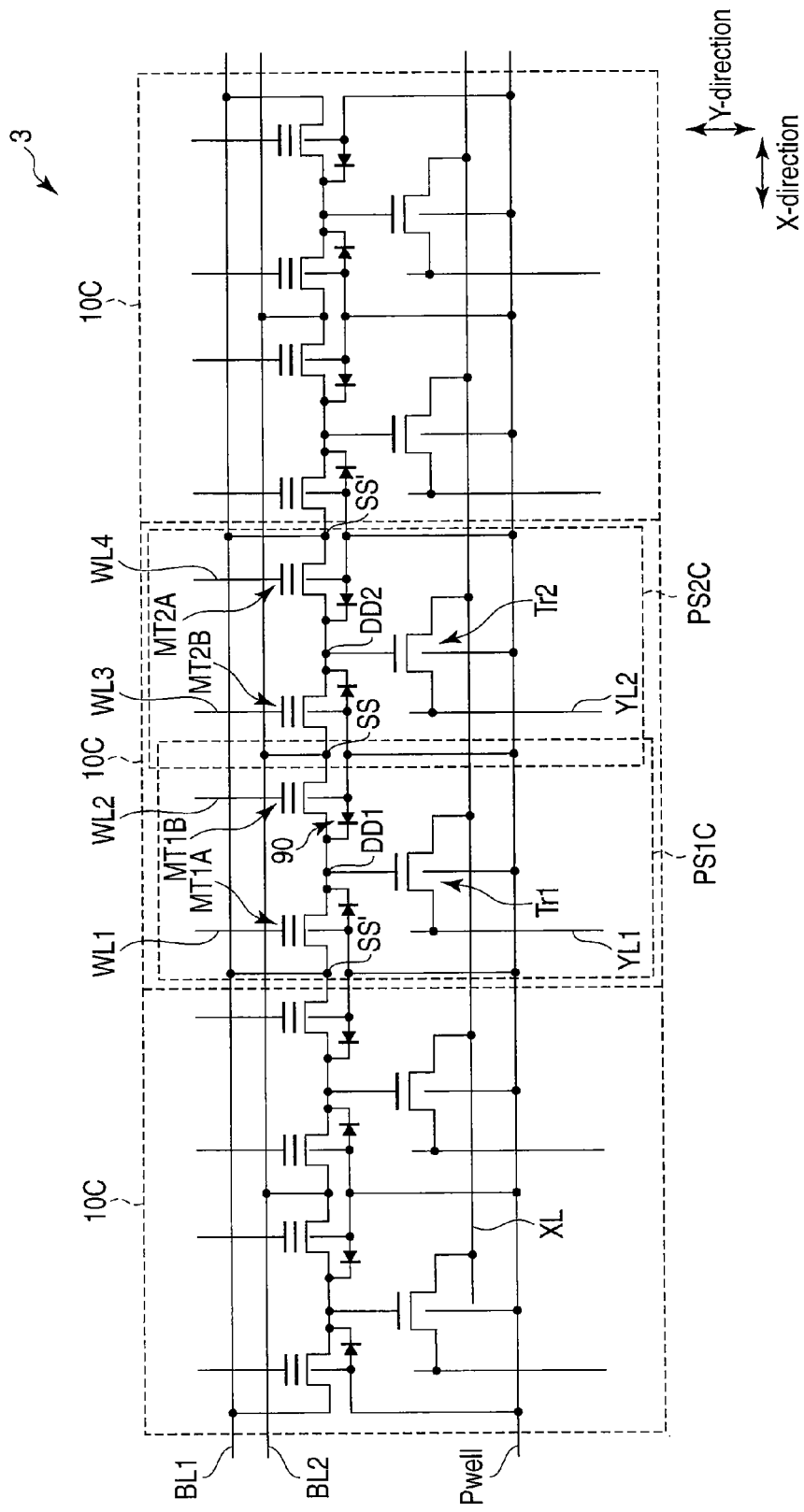
FIG. 16 is an equivalent circuit diagram of a switch array according to a third embodiment.

The circuit configuration of the switch array 3 in the third embodiment will be described using FIG. 16. FIG. 16 is an equivalent circuit diagram showing the circuit configuration of the switch array 3 in the third embodiment.

In the present embodiment, as shown in FIG. 16, each of switches PS1C and PS2C includes two memory cell transistors MT1A and MT1B and one pass transistor.

Like in the first and second embodiments, the switch array 3 in FIG. 16 has three switch units 100 arranged in the X-direction.

One switch unit 100 includes the two switches (first and second switches) PS1C and PS2C. In one switch unit 100, the two switches PS1C and PS2C are adjacent to each other in the X-direction.

In the switch array 3 in the present embodiment, one switch PS1C is formed of the two memory cell transistors MT1 and MT2 as configuration memories and one pass transistor Tr1.

That is, one switch unit 100 includes four memory cell transistors MT1A, MT1B, MT2A, and MT2B and the two pass transistors Tr1 and Tr2.

In one switch PS1C of the switch unit 100, the gate (first gate) of the memory cell transistor (first memory cell transistor) MT1A is connected to the word line (control line) WL1 and the source (first source) of the memory cell transistor MT1A is connected to the bit line BL1. In the switch PS1C, the memory cell transistor (second memory cell transistor) MT1B paired with the memory cell transistor MT1A has the gate (second gate) thereof connected to the word line WL2 and the source (second source) thereof connected to the second bit line BL2, which is different from the first bit line BL1. Thus, in the present embodiment, two bit lines are provided in the switch array 3. The first and second bit lines (control lines) BL1 and BL2 extend in the X-direction (first direction).

The two memory cell transistors MT1A and MT1B of one switch have drains thereof mutually connected to form a shared drain (first drain) DD1.

In the other switch PS2C of the switch unit 10C, the gate (fourth gate) of the memory cell transistor (third memory cell transistor) MT2A is connected to a word line WL4 and the source (fourth source) of the memory cell transistor MT2A is connected to the bit line BL1. In the switch PS2C, the memory cell transistor (fourth memory cell transistor) MT2B paired with the memory cell transistor MT2A has the gate (fifth gate) thereof connected to a word line WL3 and the source thereof connected to the second bit line BL2, which is different from the first bit line BL1.

The bit line BL1 and the bit line BL2 form a bit line pair and when the switch array 3 operates, voltages that are complementary to each other (for example, VDD and VSS) are applied.

The two memory cell transistors MT2A and MT2B of one switch PS2C have drains thereof mutually connected to form a shared drain (third drain) DD2.

In the two switches PS1C and PS2C adjacent to each other in one switch unit 10C, the two memory cell transistors MT1B and MT2B adjacent to each other are connected to the bit line BL2 by sharing the sources thereof. The shared source SS is formed by the sources of the two memory cell transistors MT1B and MT2B being mutually connected.

In the two switch units 10C adjacent to each other in the X-direction, two memory cell transistors adjacent to each other have sources thereof mutually connected to form a shared source SS'.

The source SS shared by transistors in the same switch unit is connected to the bit line BL2. The source SS' shared by transistors of different switch units is connected to the bit line BL1.

In one switch PS1C of the switch unit 10C, the gate (third gate) of the pass transistor (first pass transistor) Tr1 is connected to the shared drain DD1 of the two memory cell transistors MT1A and MT1B.

In the other switch PS2C of the switch unit 10C, the gate (sixth gate) GT1 of the pass transistor (second pass transistor) Tr2 is connected to the shared drain DD2 of the two memory cell transistors MT2A and MT2B.

In the switch array 3, different Y-interconnects YL1 and YL2 are connected to the sources (third and fifth sources) of the pass transistors Tr1 and Tr2 respectively and the common X-interconnect XL is connected to the drains (second and fourth drains) of the pass transistors Tr1 and Tr2.

In the switch array 3, the substrate interconnect Pwell to apply a substrate bias to the memory cell transistors MT1A, MT1B, MT2A, and MT2B and the pass transistors Tr1 and Tr2 is connected to the transistors MT, Tr1, and Tr2 in common.

Like memory cell transistors in the first and second embodiments, the memory cell transistors MT1A, MT1B, MT2A, and MT2B are field-effect transistors in the stack gate structure having a charge storage layer. The charge storage layer of the memory cell transistors MT1A, MT1B, MT2A, and MT2B may be a floating gate (polysilicon) or an insulating layer (SiN) having a trap level.

The operation of the switches PS1C and PS2C and the switch array 3 in the third embodiment will be described. In the present embodiment, the two memory cell transistors MT1A and MT1B mutually sharing drains are used to control ON/OFF of one pass transistor.

Like in the first embodiment, the switch array 3 has a function to select one Y-interconnect YL of the Y-interconnects YL connected to the pass transistors Tr1 and Tr2 to connect the selected Y-interconnect YL and the X-interconnect XL in accordance with ON/OFF of the pass transistors.

Like in the first embodiment, operation modes of the switch array 3 in the present embodiment include the erase operation of the memory cell transistors, the write operation into the memory cell transistors, and the FPGA operation as a switch.

The erase operation of the memory cell transistors is the same as in the first embodiment and thus, a description thereof is omitted.

In the two memory cell transistors MT1A, MT1B, MT2A, and MT2B in one switch PS1C/PS2C, the write operation into each of the transistors MT1A, MT1B, MT2A, and MT2B is the same as in the first embodiment and thus, a description thereof is omitted.

In the present embodiment, however, mutually different data is written into two memory cell transistors sharing drains. If, for example, one memory cell transistor is turned on, the other memory cell transistor is turned off. That is, after an erase operation, a write operation into one memory cell transistor MT1A/MT1B or MT2A/MT2B of the two memory cell transistors MT1A, MT1B, MT2A, and MT2B in the switches PS1C and PS2C is performed.

In the present embodiment, the FPGA operation is performed as follows:

The FPGA operation is performed when the switch PS1C or PS2C is caused to function as a switch block of FPGA after a write operation into the memory cell transistor MT1A/MT1B of the switch array 1 is performed.

In the FPGA operation, 0 V is applied to all the word lines and 0 V is applied to the gates of memory cell transistors. The memory cell transistors are turned on or off in accordance with information (a program state or erase state) written into the memory cell transistors MT1A and MT1B.

For example, the power supply voltage VDD is applied to one bit line BL1 and 0 V is applied to the other bit line BL2.

If, for example, the memory cell transistor MT1A is turned on and the memory cell transistor MT1B is turned off in one switch PS1C, the voltage VDD of the bit line BL1 connected to the source SS' of the memory cell transistor MT1A is transferred to the shared drain DD1 of these memory cell transistors MT1A and MT1B.

Then, the voltage VDD is applied to the gate of the pass transistor Tr1 and the interconnects YL and XL connected to the source and drain of the pass transistor Tr1 respectively are brought into conduction.

If the memory cell transistor MT1A is turned off and the second memory cell transistor MT1B is turned on, the voltage of the bit line BL2 is transferred to the shared drain DD1 of the memory cell transistors MT1A and MT1B. Thus, 0 V is applied to the gate of the pass transistor Tr1. The interconnect connecting the source and drain of the pass transistor Tr1 is brought out of conduction.

By increasing the voltage applied to the bit line BL1, the voltage applied to the gates of the pass transistors Tr1 and Tr2 can be made higher than the power supply voltage VDD. Accordingly, current characteristics of the pass transistors Tr1 and Tr2 can be improved.

(b) Structure

The structure of the switch array 3 and the switches PS1C and PS2C in the third embodiment will be described using FIGS. 17 to 25.

Figure 17:
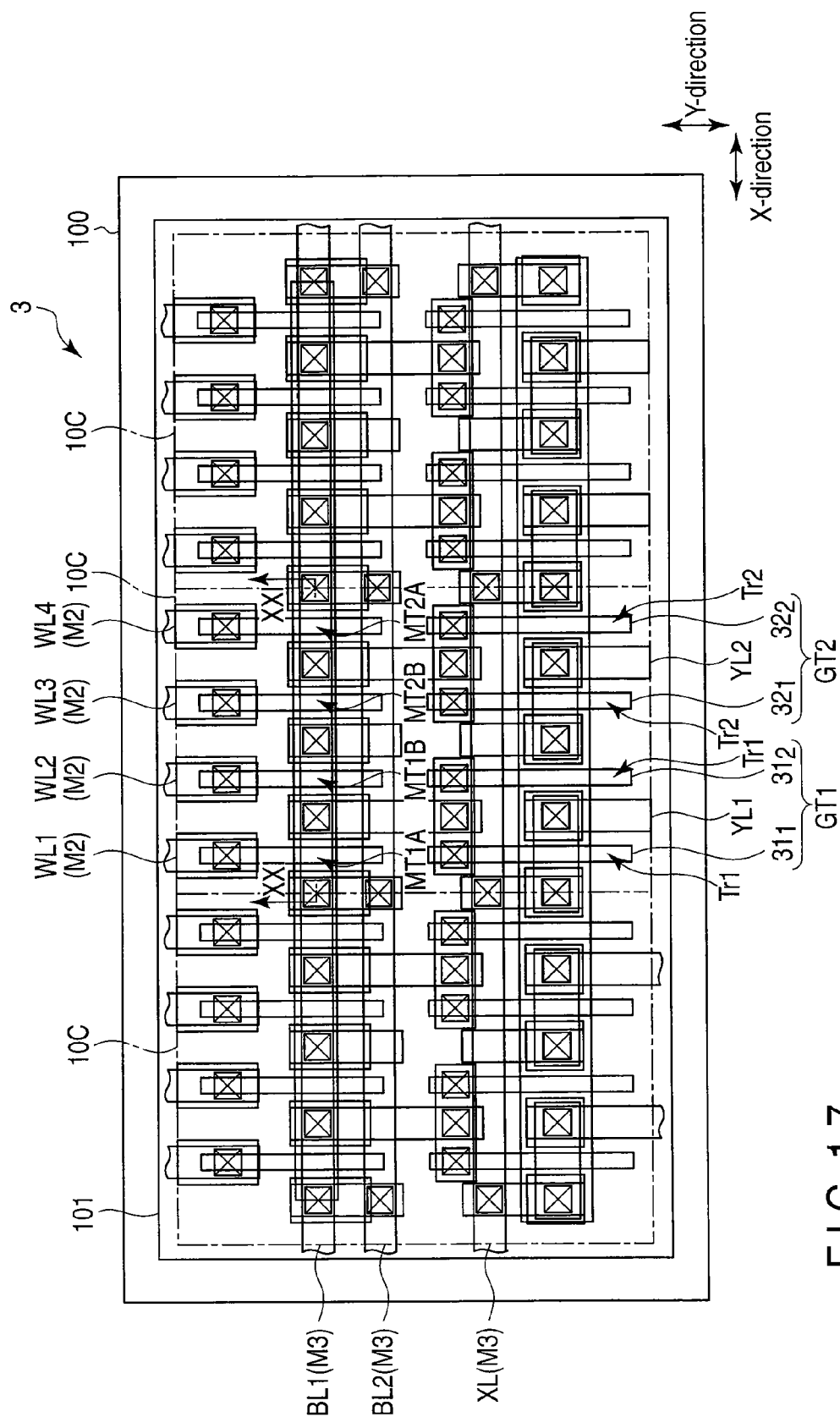
Figure 18:
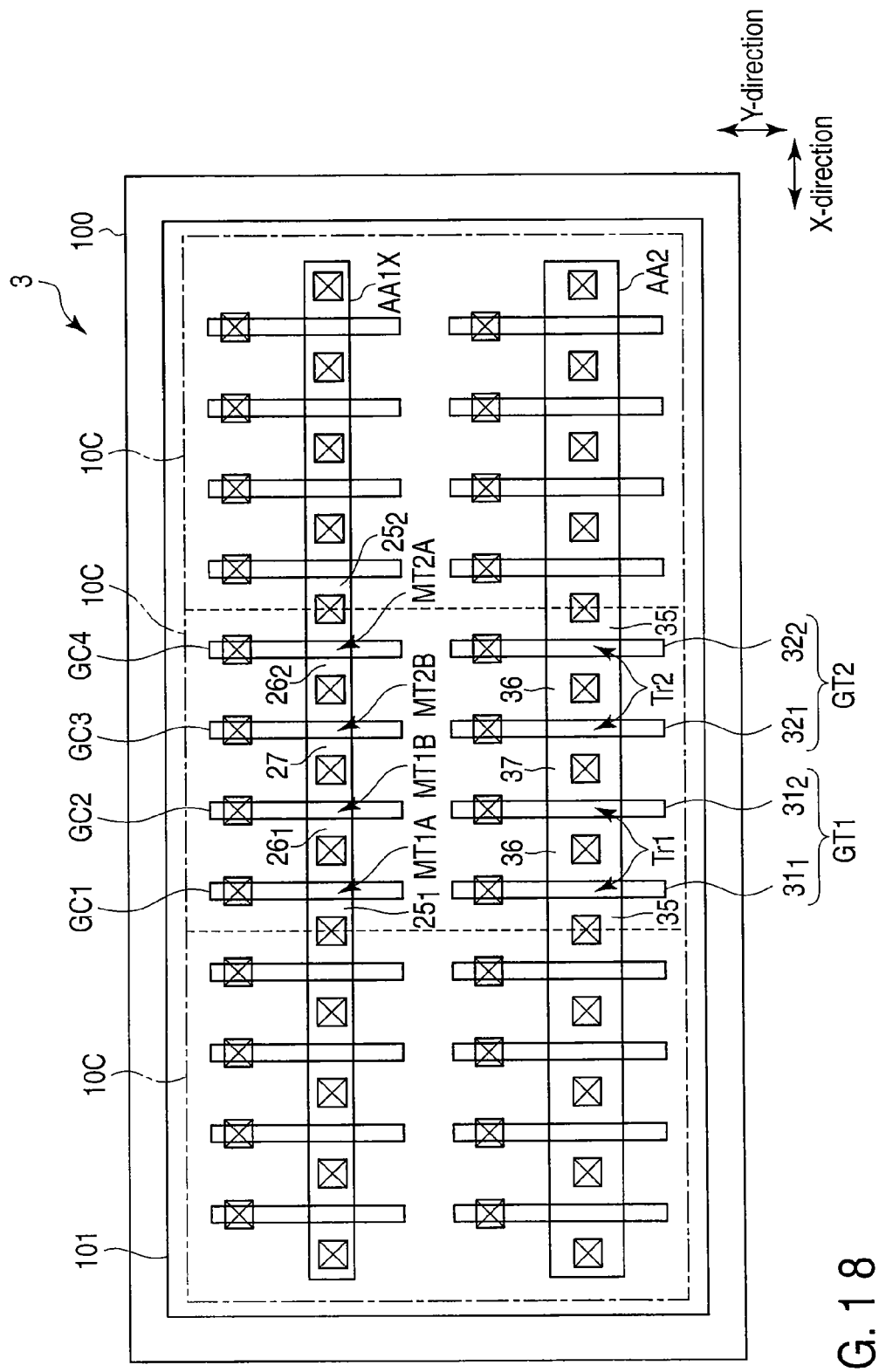
Figure 19:
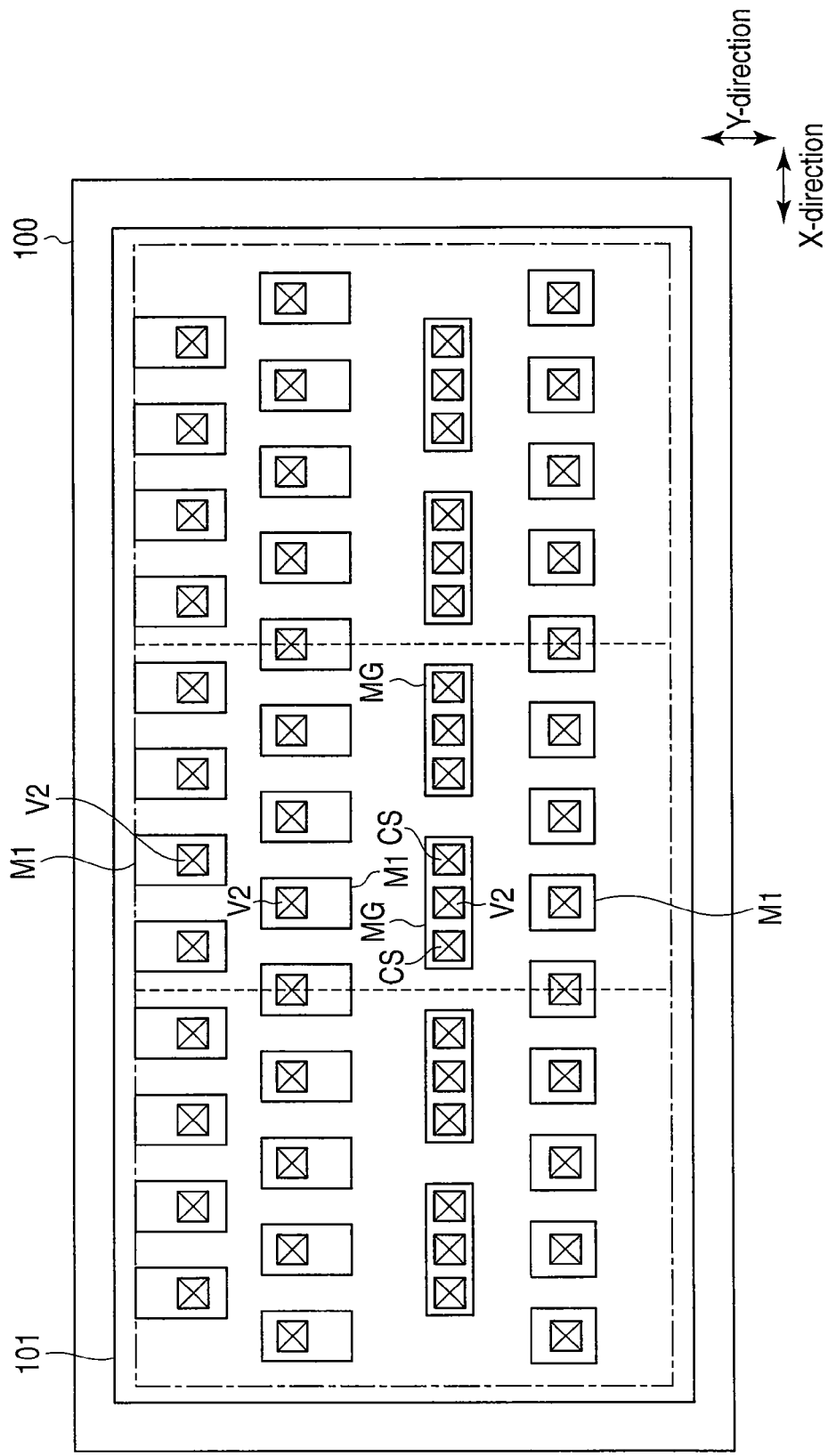

FIG. 17 shows a plane layout of the switch array 3 and the switches PS1C and PS2C in the third embodiment. FIGS. 18 to 20 show the plane layout of the switch array 3 as appropriate in accordance with the interconnect level. FIG. 18 mainly shows a layout of active regions provided in the semiconductor substrate, a gate electrode of each transistor, and contact plugs connected to the active regions and the gate electrodes. FIG. 19 mainly shows a layout of interconnect provided at the first interconnect level. FIG. 20 shows a layout of interconnect provided at the second and third interconnect levels. FIG. 21 shows a section structure along an XXI-XXI line in FIG. 20.

Like in the first and second embodiments, the plurality of memory cell transistors MT and the plurality of pass transistors Tr1 and Tr2 are formed in the P-type well region 101 of the semiconductor substrate 100.

The memory cell transistors MT1A, MT1B, MT2A, and MT2B are provided in an active region AA1X defined by isolation regions and the pass transistors Tr1 and Tr2 are provided in the active region AA2 defined by isolation regions.

The active region AA2 as a pass transistor formation area extends, like in the first and second embodiments, from one end of the switch array 3 to the other end thereof in the X-direction.

In the present embodiment, the active region AA1X as a memory cell transistor formation area extends, like the active region AA2, from one end of the switch array 3 to the other end thereof in the X-direction.

The two active regions AA1X and AA2 extend in the X-direction in parallel with each other.

In the present embodiment, the active region AA1X does not need to be electrically divided into active regions for each of the switches PS1C and PS2C and the switch unit 10C by isolation insulating layers. Thus, the occupation area of isolation regions for the active region AA1X can be reduced. The active region AA1X becomes a linear pattern extending in the X-direction, which makes the formation of the active region AA1X easier. Moreover, an influence of variations in shape of active region is controlled so that variations in characteristics of the plurality of memory cell transistors MT1A, MT1B, MT2A, and MT2B in the switch array 3 can be reduced.

In the present embodiment, as shown in FIGS. 17 and 18, like in the first and second embodiments, gate electrodes GC1, GC2, GC3, and GC4 of the memory cell transistors MT1A, MT1B, MT2A, and MT2B and the gate electrodes GT1 and GT2 of the pass transistors Tr1 and Tr2 are laid out in the switch array 3 so as to have a line-and-space pattern.

One switch unit 100 includes the two switches PS1C and PS2C.

One switch PS1C includes the two memory cell transistors MT1A and MT1B and the pass transistor Tr1.

As shown in FIG. 21, the two memory cell transistors MT1A and MT1B share a source diffusion layer $26_1$ formed in the active region AA1.

Likewise, the other switch PS2C includes the two memory cell transistors MT2A and MT2B and the pass transistor Tr2. The memory cell transistors MT2A and MT2B share a drain diffusion layer $26_2$ formed in the active region AA1X.

Further, in the switches PS1C and PS2C adjacent to each other in the active region AA1X, the memory cell transistors MT1B and MT2B adjacent to each other share the source diffusion layer 27 (SS) formed in the active region AA1X.

The source diffusion layer 27 shared by the memory cell transistors MT1B and MT2B in one switch unit 10C is connected to the second bit line BL2 via the interconnects M1 and M2 and a plug.

The memory cell transistors MT1A and MT2A adjacent to each other in the X-direction in the two different switch units 100 share source diffusion layers $25_1$ and $25_2$ (SS'). The source diffusion layers $25_1$ and $25_2$ (SS') are connected to the first bit line BL1 via the interconnects M1 and M2 and plugs $CP_x$ and V1. Thus, with the source diffusion layer $25_1$ and $25_2$ connected to the bit line BL1 being shared by the memory cell transistors MT1A and MT2A of the mutually different switch units 100, dense interconnect can be avoided. Therefore, numbers of interconnects and interconnect levels to form the switch array 3 can be controlled.

The first bit line BL1 is provided at the same interconnect level as the second bit line BL2. For example, the first and second bit lines BL1 and BL2 are formed by using the third interconnect M3 when counted from the substrate side.

The first and second bit lines BL1 and BL2 are adjacent to each other in the Y-direction at the third interconnect level.

Shared drain diffusion layers $26_1$ and $26_2$ are connected to the gate electrodes GT1 and GT2 of the pass transistors Tr1 and Tr2 via the interconnects M1 and M2 and the plugs CP and V1.

Thus, with the source/drain diffusion layers $25_1$, $25_2$, $26_1$, $26_2$, and 27 formed in the active region AA1X, the plug CS, and the interconnects M1 and M2 being shared by the memory cell transistors MT1A, MT1B, MT2A, and MT2B adjacent to each other, the cell size of the memory cell transistors MT1A, MT1B, MT2A, and MT2B and the area of the switches including the transistors can be reduced.

Like in the first and second embodiments, the gate electrodes GT1 and GT2 of the pass transistors Tr1 and Tr2 are formed by two gate electrode regions $31_1$, $31_2$, $32_1$, and $32_2$ adjacent to each other being connected by the interconnect (gate interconnect) MG in the active region AA2.

Substantially like the configuration shown in FIG. 9, the gate interconnect MG is connected to the drain diffusion layer $26_1$ or $26_2$ corresponding to the interconnect MG via the interconnect M2 and plugs V1. Thus, it is preferable that the gate interconnect MG be arranged in the same straight line as the common drain diffusion layers $26_1$ and $26_2$ in the Y-direction to simplify the layout of interconnect.

FIGS. 22 to 25 show modification of the switch array shown in FIGS. 16 to 21.

FIG. 22 is an equivalent circuit diagram showing the circuit configuration of the modification of the switch array 3 in the third embodiment.

The switch array 3 in the third embodiment can make an erase/write operation from/into a memory cell transistor an operation using a floating gate edge of the memory cell transistor by adopting the connection relationship between word lines and bit lines shown in FIG. 22.

In the switch PS1C in FIG. 22, the memory cell transistor MT1A has a gate connected to the word line WL1 and the source SS' connected to the first bit line BL1. Also in the switch PS1C, the memory cell transistor MT1B paired with the memory cell transistor MT1A has a gate connected to the word line WL2 that is different from the first word line WL1 and the source SS connected to the second bit line BL2 that is different from the first bit line BL1. The first and second word lines WL1 and WL2 extend in the X-direction.

In the erase operation from memory cell transistors in a switch array shown in FIG. 22, the voltage of 0 V is applied to the word lines WL1 and WL2 connected to the gates of the memory cell transistors MT1A and MT1B in the switch array 3 intended for erase operation. Along with the application of 0 V to the word lines, an erase voltage is applied to the bit lines BL1 and BL2 connected to the respective sources of the memory cell transistors MT1A and MT1B. At this point, the substrate interconnect Pwell connected to the memory cell transistors MT1A and MT1B is put into a floating state. The erase voltage is on the order of, for example, 15 V to 20 V.

Then, an electric field applied to a tunnel insulating layer between the sources of the memory cell transistors MT1A and MT1B and the floating gate becomes stronger and electrons in the charge storage layer are emitted to the source side due to the tunnel effect.

In the write operation into memory cell transistors in the switch array shown in FIG. 22, a write voltage is applied to the word line WL1 connected to the gate of the memory cell transistor MT1A intended for write operation. The voltage of 0 V is also applied to the word line WL2 connected to the gate of the memory cell transistor MT1B that is not intended for write operation. Then, 0 V is applied to the bit line BL1 connected to the source of the memory cell transistor MT1A. On the other hand, the bit line BL2 connected to the source of the memory cell transistor MT1B is put into a floating state. At this point, the substrate interconnect Pwell connected to the memory cell transistors MT1A and MT1B is put into a floating state. The write voltage is on the order of, for example, 15 V to 20 V.

Then, an electric field applied to the tunnel insulating layer between the source of the memory cell transistor MT1A and the floating gate becomes stronger and electrons are injected into the charge storage layer due to the tunnel effect.

Figure 25:
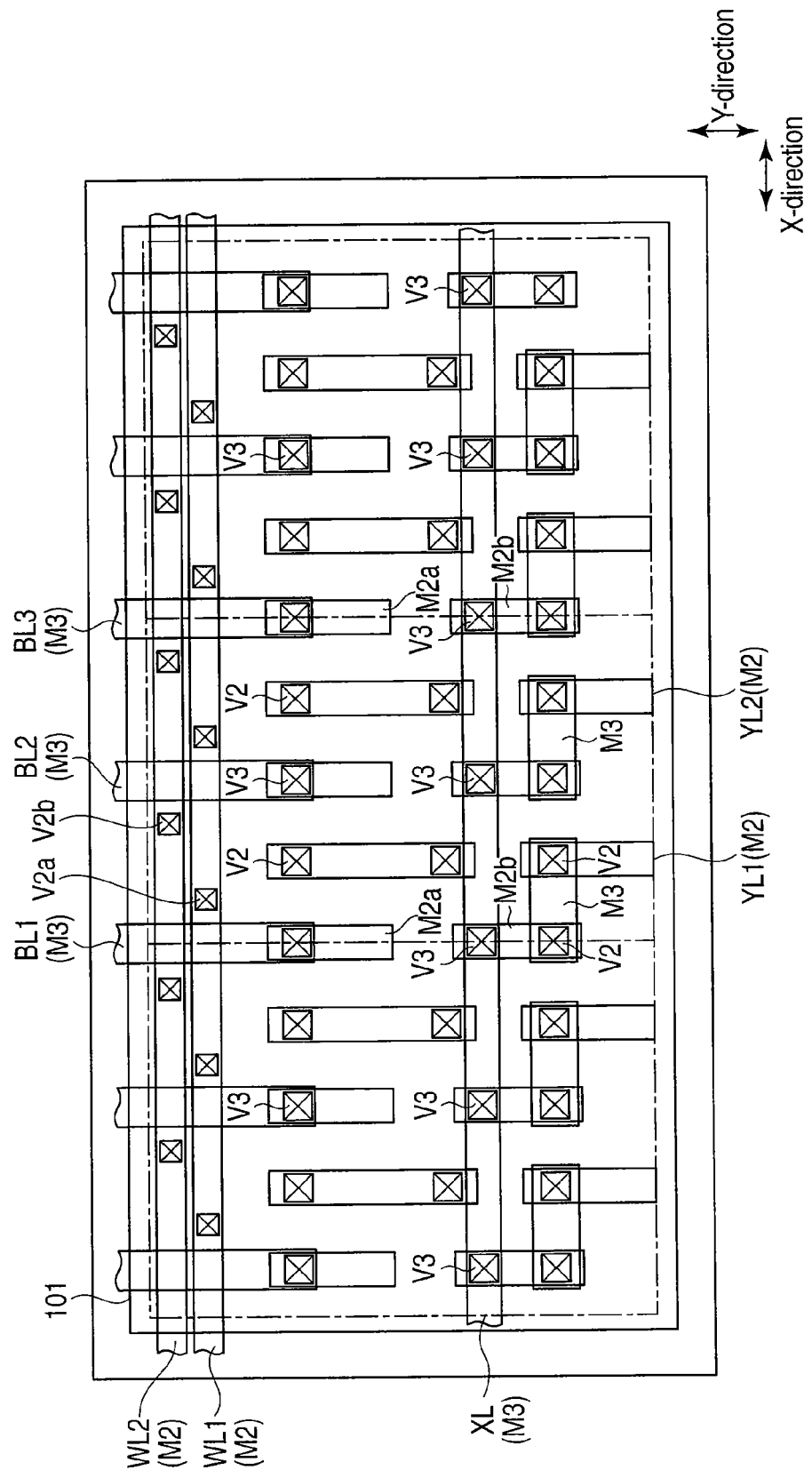

The structure of modifications of the switch array 3 in the third embodiment will be described using FIGS. 23 to 25. FIG. 23 shows the plane layout of modifications of the switch array in the third embodiment. FIGS. 24 and 25 show the plane layout of the switch array 3 as appropriate in accordance with the interconnect level. FIG. 24 mainly shows a layout of interconnect provided at the first interconnect level. FIG. 25 shows a layout of interconnect provided at the second and third interconnect levels. In the switch array 3 in FIGS. 22 and 23, the layout of active regions provided in the semiconductor substrate, a gate electrode of each transistor, and contact plugs connected to the active regions and the gate electrodes is substantially the same as the pattern shown in FIG. 18 and thus, a description thereof is omitted. The section structure of the switch array 3 in FIG. 22 is substantially the same as the structure shown in FIG. 21 except that only the structure of bit lines and word lines is different and thus, a description thereof is omitted.

As shown in FIGS. 23 and 25, the bit lines BL1 and BL2 are formed by using the interconnect M3 positioned at the third interconnect level. The word lines WL1 and WL2 are formed by using the interconnect M2 positioned at the second interconnect level. The two word lines WL1 and WL2 are adjacent to each other in the Y-direction. As shown in FIGS. 23 to 25, plugs V2a and V2b on the interconnect M1 connect the word lines WL1 and WL2 and the gates of the memory cell transistors MT1A and MT1B. The plugs V2a connected to the word line WL1 and the plugs V2b connected to the word line WL2 are laid out so as to be mutually shifted in a direction (Y-direction) crossing the direction in which the word lines WL1 and WL2 extend. The plug V2a is shifted toward the switch transistor side in a horizontal direction with respect to the substrate surface and the plug V2b is shifted toward the side opposite to the switch transistor side.

In the switch array 3 and the switches PS1C and PS2C in the third embodiment, the memory cell transistors MT1A, MT1B, MT2A, and MT2B and the pass transistors Tr1 and Tr2 are arranged on the chip 100 so as to be adjacent to each other in the channel width direction (Y-direction) of the transistors. The four memory cell transistors MT1A, MT1B, MT2A, and MT2B or more are arranged along the channel length direction (X-direction) of the transistors in the common active region AA1X. The plurality of pass transistors Tr1 and Tr2 is arranged along the channel length direction (X-direction) of the transistors.

The active region AA1X in which the plurality of memory cell transistors MT1A, MT1B, MT2A, and MT2B is arranged is adjacent to the active region AA2 in which the plurality of pass transistors Tr1 and Tr2 is arranged in the channel width direction of the transistors. The active region AA1X and the active region AA2 are arranged on the substrate in parallel with each other.

The gate electrodes GC1, GC2, GC3, and GC4 of the memory cell transistors MT1A, MT1B, MT2A, and MT2B and the gate electrodes GT1 and GT2 of the pass transistors Tr1 and Tr2 have a line-and-space layout on the chip. The source/drain diffusion layers $25_1$, $25_2$, $26_1$, $26_2$, and 27 and contact plugs/interconnects connected to these diffusion layers $25_1$, $25_2$, $26_1$, $26_2$, and 27 can be shared between transistors adjacent to each other in the channel length direction among the memory cell transistors MT1A, MT1B, MT2A, and MT2B and the pass transistors Tr1 and Tr2.

Accordingly, the occupation area of the switches PS1C and PS2C and the switch array 3 can be reduced. Further, there is no need to use a complex interconnect pattern or layout so that manufacturing costs of the switches PS1C and PS2C and the switch array 3 using the switches can be reduced.

According to the present embodiment, the two memory cell transistors MT1A and MT1B are provided for one pass transistor Tr1. Though the number of elements forming a switch is thereby increased, a voltage closer to 0 V can be provided to the gate of the pass transistor Tr1 when the pass transistor Tr1 is turned off. Therefore, a switch array in the third embodiment has the advantage in electric characteristics when compared with a switch array in the first embodiment.

According to the switch array 3 in the third embodiment, as described above, like in the first and second embodiments, the area of the switch array 3 can be made smaller (4) Others According to the first to third embodiments, the occupation area of a switch array can be made smaller.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switch array comprising:
a switch unit provided on a substrate, including;
a first switch provided in the switch unit and including first and second memory cell transistors and a first pass transistor,
the first memory cell transistor provided in a first active region in the substrate and including a first source, a first drain, and a first gate,
the second memory cell transistor provided in the first active region adjacent to the first memory cell transistor in a channel length direction of the first memory cell transistor and including the first drain shared with the first memory cell transistor, a second source, and a second gate, and
the first pass transistor provided in a second active region in the substrate and including a second drain, a third source, and a third gate connected to the first drain; and
a second switch provided in the switch unit and including third and fourth memory cell transistors and a second pass transistor,
the third memory cell transistor provided in the first active region adjacent to the second memory cell transistor in the channel length direction of the first memory cell transistor and including the second source shared with the second memory cell transistor, a third drain, and a fourth gate,
the fourth memory cell transistor provided in the first active region adjacent to the third memory cell transistor in the channel length direction of the first memory cell transistor and including the third drain shared with the third memory cell transistor, a fourth source, and a fifth gate, and
the second pass transistor provided in the second active region adjacent to the first pass transistor in the channel length direction of the first pass transistor and including a fourth drain, a fifth source, and a sixth gate connected to the third drain,
wherein the first and second active regions are adjacent to each other in a channel width direction of each transistor.

2. The array according to claim 1, wherein the first and fourth source are shared by the switch units adjacent to each other in the channel length direction of the memory cell transistor.

3. The array according to claim 1, wherein the third and sixth gate have multiple gate fingers, respectively.

4. The array according to claim 3, wherein the third and the sixth gate have two gate fingers, respectively.

5. The array according to claim 1, wherein the long sides of the third and sixth gates are in a parallel direction with the channel width of the first memory cell transistor, respectively.

6. The array according to claim 1, wherein the long sides of the third and sixth gates are arranged in a same straight line with the long sides of the first or second gates and forth or fifth gates, respectively.

7. The array according to claim 1, wherein each of the first, second, fourth, and fifth gates includes a gate insulating layer on a channel region in the first active region, a charge storage layer on the gate insulating layer, an insulator on the charge storage layer, and control gate electrodes on the insulator.

8. The array according to claim 1, further comprising:
a first bit line connected to the first and fourth sources;
a second bit line connected to the second source; and
first to fourth word lines connected to the first, second, fourth, and fifth gates, respectively.

9. The array according to claim 1, further comprising:
a first word line connected to the first and fourth gates;
a second word line connected to the second and fifth gates; and
first to third bit lines connected to the first, second, and fourth sources, respectively.

10. The array according to claim 1, wherein the first to forth memory cell transistors are used as a configuration memory of a FPGA.

11. A switch array comprising:
a switch unit provided on a substrate, including;
a first control line;

a first switch provided in the switch unit and including a first memory cell transistor and a first pass transistor, the first memory cell transistor provided in a first active region in the substrate and including a first source connected to the first control line, a first drain, and a first gate, and the first pass transistor provided in a second active region in the substrate and including a second source, a second drain, and a second gate connected to the first drain; and a second switch provided in the switch unit and including a second memory cell transistor and a second pass transistor, the second memory cell transistor provided in the first active region adjacent to the first memory cell transistor in a channel length direction of a transistor and including the first source shared with the first memory cell transistor, a third drain, and a third gate, and the second pass transistor provided in the second active region and including a third source, the second drain shared with the first pass transistor, and a fourth gate connected to the third drain, wherein the first and second active regions are adjacent to each other in a channel width direction of each transistor.

12. The array according to claim 11, wherein the first switch includes a first inverter having a first input node connected to the first drain and a first output node connected to the second gate, and the second switch includes a second inverter having a second input node connected to the third drain and a second output node connected to the fourth gate.

13. The array according to claim 12, wherein the sources of the first and second inverter are shared by the switch units adjacent to each other in the channel length direction of the memory cell transistor.

14. The array according to claim 11, wherein the second and fourth gate have multiple gate fingers, respectively.

15. The array according to claim 14, wherein the second and fourth gate have two gate fingers, respectively.

16. The array according to claim 11, wherein the long sides of the second and the forth gates are in a parallel direction with the channel width of the first memory cell transistor.

17. The array according to claim 14, wherein the long sides of multiple gate fingers are in a parallel direction with the channel width of the first memory cell transistor, respectively.

18. The array according to claim 15, wherein the long side of one gate finger is in a same straight line as the first or third gate in the channel width direction of the memory cell transistor, the long side of the other gate finger is in a same straight line as the first or second input node in the channel width direction of the memory cell transistor.

19. The array according to claim 14, wherein a first area of the first inverter includes a third active region in the substrate and a second area of the second inverter includes a fourth active region in the substrate, and the third and fourth active regions are adjacent to the first active region in the channel width direction of the memory cell transistor, respectively.

20. The array according to claim 11, wherein the first and second memory cell transistors are used as a configuration memory of a FPGA.

\* \* \* \* \*